(12) United States Patent
Kang et al.

(10) Patent No.: US 7,446,387 B2
(45) Date of Patent: Nov. 4, 2008

(54) HIGH VOLTAGE TRANSISTOR AND METHODS OF MANUFACTURING THE SAME

(75) Inventors: Mi-Hyun Kang, Seoul (KR); Hwa-Sook Shin, Suwon-si (KR); Mueng-Ryul Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 274 days.

(21) Appl. No.: 11/257,914

(22) Filed: Oct. 25, 2005

(65) Prior Publication Data
US 2006/0086992 A1 Apr. 27, 2006

(30) Foreign Application Priority Data
Oct. 27, 2004 (KR) .......................... 10-2004-86262

(51) Int. Cl.
*H01L 29/06* (2006.01)
(52) U.S. Cl. .............................. 257/493; 257/E29.256; 257/E29.027; 257/E21.427; 438/286
(58) Field of Classification Search ................. 438/286; 257/493, E21.417, E21.427, E29.027, E29.067, 257/335, E29.256
See application file for complete search history.

(56) References Cited

U.S. PATENT DOCUMENTS

| | | | | |
|---|---|---|---|---|
| 5,512,495 A | 4/1996 | Mei et al. ..................... 437/28 |
| 6,258,670 B1 * | 7/2001 | Tung .......................... 438/268 |
| 6,265,752 B1 * | 7/2001 | Liu et al. ..................... 257/487 |
| 6,468,870 B1 * | 10/2002 | Kao et al. .................... 438/297 |
| 6,770,951 B2 * | 8/2004 | Huang et al. ................. 257/557 |
| 6,861,341 B2 * | 3/2005 | Chen et al. ................... 438/527 |

FOREIGN PATENT DOCUMENTS

| JP | 11-135794 | | 5/1999 |
|---|---|---|---|
| KR | 1999-51079 | * | 7/1999 |
| KR | 1020030014155 A | | 2/2003 |
| TW | 463269 A | * | 11/2001 |

* cited by examiner

*Primary Examiner*—Trung Dang
(74) *Attorney, Agent, or Firm*—F. Chau & Associates, LLC.

(57) ABSTRACT

In a HV transistor having a high breakdown voltage and a method of manufacturing the same, a first insulation pattern is formed on a semiconductor substrate by oxidizing a portion of the substrate, and a second insulation pattern is formed such that at least a portion of the first insulation pattern is covered with the second insulation pattern. A gate electrode including a first end portion and a second end portion opposite to the first end portion is formed on the substrate by depositing conductive materials onto the substrate. The first end portion is formed on the first insulation pattern and the second end portion is formed on the second insulation pattern. Source/drain regions are formed at surface portions of the substrate by implanting impurities onto the substrate. Electric field intensity at an edge portion of the gate electrode is reduced, and the HV transistor has a high breakdown voltage.

38 Claims, 20 Drawing Sheets

HIGH VOLTAGE TRANSISTOR AND METHODS OF MANUFACTURING THE SAME

CROSS-REFERENCE TO RELATED APPLICATION

This application claims priority to Korean Patent Application No. 2004-86262 filed on Oct. 27, 2004, the content of which is herein incorporated by reference in its entirety.

BACKGROUND OF THE INVENTION

1. Field of the Invention

The present invention relates to a high voltage transistor and a method of manufacturing the same. More particularly, the present invention relates to a high voltage transistor of which a breakdown voltage is high and to methods of manufacturing the same.

2. Description of the Related Art

In general, a metal oxide semiconductor field effect transistor (hereinafter referred to as MOSFET) includes three different operation regions.

FIG. 1 is a graph illustrating an electrical characteristic of a drain in an N channel enhancement type MOSFET.

As shown in FIG. 1, in the N channel enhancement type MOSFET, an inversion layer that is a conductive channel in a transistor is formed in a portion of the channel of the MOSFET, and the MOSFET is operated on condition that a threshold voltage $V_t$ is positive and a voltage $V_{gs}$ between a gate and a source of the MOSFET is over a threshold voltage $V_t$.

When the voltage $V_{gs}$ is less than the threshold voltage $V_t$, the inversion layer is not formed and a current does not pass through the MOSFET. The region in which the voltage $V_{gs}$ is less than the threshold voltage $V_t$ is referred to as a cut-off region.

When the voltage $V_{gs}$ is greater than the threshold voltage $V_t$ and the MOSFET is operated, the amount of current passing through the MOSFET is determined in accordance with a voltage difference between the source and drain $V_{ds}$. In a case in which the voltage difference $V_{ds}$ is relatively low, the current is linearly proportional to the voltage difference $V_{ds}$. The region in which the current is linearly proportional to the voltage difference $V_{ds}$ is referred to as a triode region.

As the voltage difference $V_{ds}$ increases, a depth of the channel around the drain gradually decreases. Finally, when the voltage difference $V_{ds}$ is greater than a saturation voltage $V_s$ corresponding to the voltage difference between the voltage $V_{gs}$ and the threshold voltage $V_t$, the channel around the drain is pinched off. As a result, a depletion region instead of the inversion layer is formed in the channel, and electrons are moved through the depletion region by the voltage applied to the depletion layer. In addition, the amount of current passing through the MOSFET is not affected by an increase of the voltage difference $V_{ds}$, and the MOSFET operates just like a static current source. The region in which the current amount is not affected by the increase of the $V_{ds}$ is referred to as a saturation region.

When the $V_{ds}$ is increased over the saturation region, the pinch-off region of the channel is gradually enlarged, and thus the channel is shortened. The shortening of the channel is generally referred to as channel length modulation. As the channel is shortened, the depletion region between the channel and the drain is enlarged, and the current $I_{ds}$ passing through the channel slightly increases as the voltage $V_{ds}$ increases.

In a case in which the voltage $V_{ds}$ is greater than a predetermined voltage $V_b$, the inversion layer disappears and only the depletion region is formed between the source and the drain of the MOSFET, and thus the current of the drain exceeds the saturation current $I_{ds}$ due to a current leakage at the drain of the MOSFET. The depletion region between the drain and the source of the MOSFET reduces the energy barrier and immobilizes the electrons. Thus, the current leaks from the drain. Current leakage from the drain is more prevalent when the channel length is less than or equal to about 2 μm. As the voltage $V_{ds}$ increases, the energy barrier also decreases, thereby increasing the leakage current. However, the leaking current is not substantially proportional to the increase of the voltage $V_{ds}$. This phenomenon is referred to as a punch-through or a soft breakdown.

When the voltage $V_{ds}$ increases over the soft breakdown, the channel is broken down due to an avalanche effect. As the voltage $V_{ds}$ increases, an electric field intensity in the MOSFET becomes higher around the corner of the drain than at a central portion of the channel. The high intensity of the electric field increases the kinetic energy of a charge carrier to a level much higher than the kinetic energy at room temperature. The charge carrier of high kinetic energy is usually referred to as a hot carrier. When some of the hot carriers contact the surface of the substrate, and impacts the atoms of the substrate, a plurality of electron hole pairs is created. This phenomenon is referred to as an avalanche effect.

In the case of an N type MOSFET, holes accumulated on a P type substrate generate a forward-biased voltage between the source and the substrate. When the forward-biased voltage between the source and the substrate is about 0.6V, the electrons move from the source to the substrate. The movement of the electrons from the source to the substrate causes the same result as a bipolar npn transistor in parallel with the MOSFET. Accordingly, supplying even a small quantity of the holes to the substrate corresponding to a base of the transistor causes a large amount of current between an emitter and a collector, which is referred to as a conventional operation of a bipolar junction transistor. In the same way, a little increase of the voltage between the drain and the source generates a large amount of current in the channel, which is referred to as a channel breakdown.

As described above, the increase of the voltage for channel breakdown requires an increase of the channel length. However, the channel length increase is not desirable in accordance with a technological trend of high integration in semiconductor devices since the area occupied by a transistor is enlarged. In addition, because an electric field intensity of a corner portion of the drain is generally higher than that of a central portion of the channel in a conventional MOS transistor, a transistor structure having a high breakdown voltage is required to lower the electric field intensity at the corner portion of the drain and minimize or prevent hot carriers.

For example, Korean Laid-Open Publication No. 1999-51079 discloses a method of fabricating a semiconductor device using an etching process obliquely performed against an insulation layer. Particularly, a thin gate oxide layer is formed on an enlarged gate area for an N channel laterally-diffused metal-oxide-silicon (LDMOS) transistor, and a low temperature oxide layer is formed on the gate oxide layer as an insulation layer. Then, the gate oxide layer is wet-etched, thereby minimizing an insulation failure due to a high electrical field intensity at the enlarged gate area for the LDMOS transistor.

However, the field oxide layer of the LDMOS transistor extends to a whole P drift region in a substrate, so that there is a problem in that impurities in the P drift region are not exhausted.

SUMMARY OF THE INVENTION

According to an exemplary embodiment of the present invention, there is provided a high voltage transistor including a semiconductor substrate, a first insulation pattern on the substrate, a second insulation pattern covering at least a portion of the first insulation pattern, a gate electrode including a first end portion and a second end portion opposite to the first end portion, and source/drain regions formed at surface portions of the substrate. The first end portion is formed correspondently to the first insulation pattern and the second end portion is formed correspondingly to the second insulation pattern.

According to an another exemplary embodiment of the present invention, there is provided a high voltage transistor including a semiconductor substrate, a thermal oxide pattern on the substrate, a chemical vapor deposition (CVD) oxide pattern covering at least a portion of the thermal oxide pattern, a gate electrode including a first end portion and a second end portion opposite to the first end portion and source/drain regions formed at surface portions of the substrate. The first end portion is formed on the thermal oxide pattern and the second end portion is formed on the CVD oxide pattern.

According to another examplary embodiment of the present invention, there is provided a high voltage transistor including a semiconductor substrate, a first well region formed on a first portion of the substrate and including first impurities, a second well region adjacent to the first well region and including second impurities, a thermal oxide pattern formed on the substrate between the first and second well regions, a chemical vapor deposition (CVD) oxide pattern covering the thermal oxide pattern and overlapped with portions of the first and second well regions, a gate electrode including a first end portion and a second end portion opposite to the first end portion, and source/drain regions formed at surface portions of the substrate. The first end portion is formed on the thermal oxide pattern and the second end portion is formed on the CVD oxide pattern. The source/drain regions are formed in the first and second well regions, respectively.

According to another exemplary embodiment of the present invention, there is provided a method of manufacturing the high voltage transistor. A first insulation pattern is formed on a semiconductor substrate by oxidizing a portion of the substrate, and a second insulation pattern covers at least one portion of the first insulation pattern. A gate electrode is formed on the substrate by depositing a conductive material onto the substrate. A first end portion of the gate electrode is formed correspondently to the first insulation pattern, and a second end portion of the gate electrode is formed correspondently to the second insulation pattern. Source/drain regions are formed at surface portions of the substrate by implanting impurities onto the substrate.

According to another exemplary embodiment of the present invention, there is provided a method of manufacturing the high voltage transistor. A thermal oxide pattern is formed on a semiconductor substrate by oxidizing a portion of the substrate. A chemical vapor deposition (CVD) oxide pattern is formed on the substrate such that the thermal oxide pattern is covered with the CVD oxide pattern. A gate electrode is formed on the substrate by depositing conductive materials, and the gate electrode includes a first end portion and a second end portion opposite to the first end portion. The first end portion of the gate electrode is formed on a first portion of the CVD oxide pattern of which a lower surface makes contact with the thermal oxide pattern, and the second end portion of the gate electrode is formed on a second portion of the CVD oxide pattern of which a lower surface makes contact with the substrate. Source/drain regions are formed at first surface portions of the substrate by implanting first impurities onto the substrate.

According to yet another exemplary embodiment of the present invention, there is provided a method of manufacturing the high voltage transistor. First and second well regions are formed at first and second surface portions of a semiconductor substrate by implanting first and second impurities onto the substrate, respectively. The second surface portions are adjacent to the first surface portions of the substrate. A thermal oxide pattern is formed on the substrate by oxidizing a portion of the substrate between the first and second well regions, and a chemical vapor deposition (CVD) oxide pattern is formed such that the thermal oxide pattern is covered with the CVD oxide pattern. A gate electrode is formed on the substrate by depositing conductive materials, and includes a first end portion and a second end portion opposite to the first end portion. The first end portion of the gate electrode is formed on a first portion of the CVD oxide pattern of which a lower surface makes contact with the thermal oxide pattern, and the second end portion of the gate electrode is formed on a second portion of the CVD oxide pattern of which a lower surface makes contact with the substrate. Source/drain regions are formed at third surface portions of the substrate by implanting third impurities onto the substrate.

According to at least one exemplary embodiment of the present invention, an edge portion of a gate electrode of a high voltage (HV) transistor is comprised of a thermal oxide, and thus an electric field intensity is sufficiently reduced at the edge portion of the gate electrode. Hot carriers caused by a high electric field intensity are minimized, and the HV transistor of the exemplary embodiments has a high breakdown voltage. Furthermore, the gate oxide layer of the HV transistor of exemplary embodiments of the present invention includes a thermal oxide pattern and a CVD oxide pattern, so that current and on-resistance characteristics may be sufficiently improved in the HV transistor of exemplary embodiments of the present invention, and more particularly, in an LDMOS transistor.

BRIEF DESCRIPTION OF THE DRAWINGS

The above and other features and advantages of exemplary embodiments of the present invention will become readily apparent by reference to the following detailed description when considering in conjunction with the accompanying drawings, in which.

DESCRIPTION OF THE EMBODIMENTS

Figure 1:
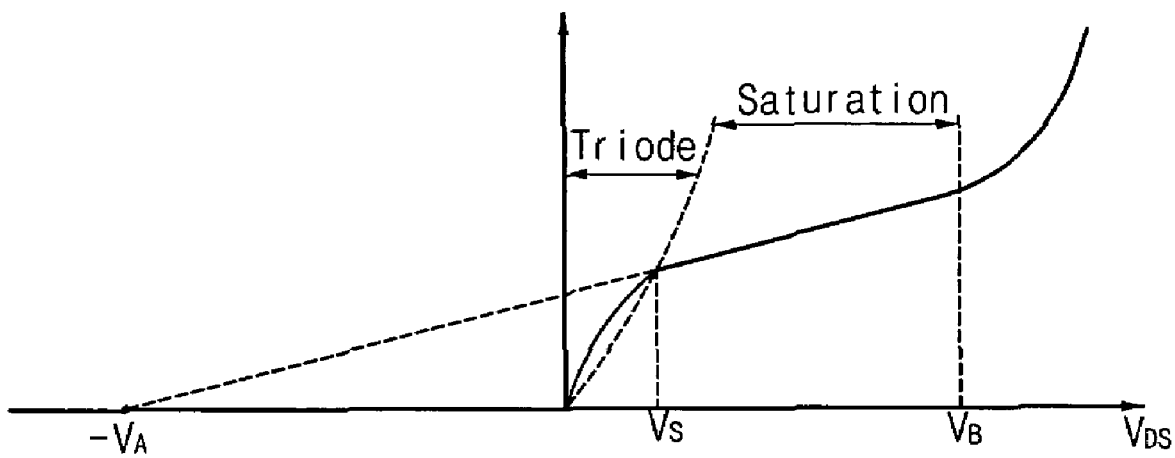
FIG. 1 is a graph illustrating an electrical characteristic of a drain in an N channel enhancement type MOSFET.

The exemplary embodiments of the present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiment 1

Figure 2:
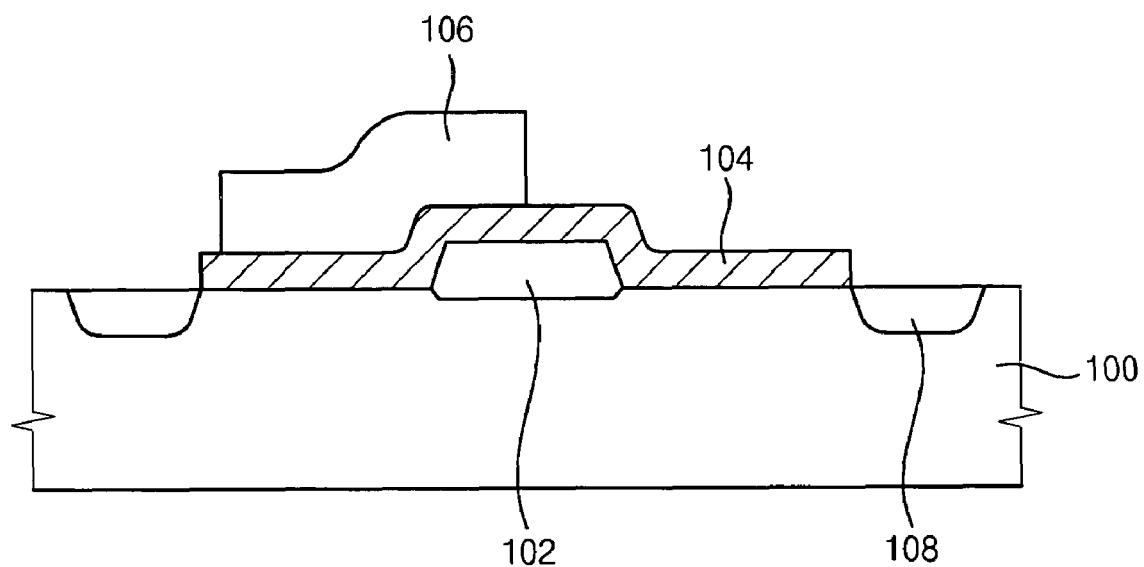
FIG. 2 is a cross sectional view illustrating a high voltage transistor according to a first exemplary embodiment of the present invention.

FIG. 2 is a cross sectional view illustrating a high voltage transistor according to a first example embodiment of the present invention.

Referring to FIG. 2, the high voltage transistor (hereinafter referred to as an HV transistor) according to the first exemplary embodiment of the present invention includes a semiconductor substrate 100, a first insulation pattern 102 on the substrate 100, a second insulation pattern 104 partially covering the first insulation pattern 102, a gate electrode 106 formed on the first and second insulation patterns 102 and 104 and source/drain regions formed at surface portions of the substrate 100. A first end portion of the gate electrode 106 is formed on the first insulation pattern 102, and a second end portion of the gate electrode 106, which is opposite to the first end portion of the gate electrode 106, is formed on the second insulation pattern 104.

The first and second insulation patterns 102 and 104 are comprised of an oxide such as a silicon oxide. An example of the silicon oxide includes silicon dioxide (SiO2). In the present exemplary embodiment, the first insulation pattern 102 includes a thermal oxide formed through a thermal oxidation process, and the second insulation pattern 104 includes a chemical vapor deposition (CVD) oxide formed through a CVD process. Accordingly, the first insulation pattern 102 has physical properties different from that of the second insulation pattern 104. For example, the thermal oxide pattern has a crystal structure that is more dense than that of the CVD oxide pattern, so that an insulation characteristic of the thermal oxide pattern is that it deteriorates less than the CVD oxide pattern even though a higher intensity of electric field is applied to the thermal oxide pattern.

The second insulation pattern 104 covers at least a portion of the first insulation pattern 102, so that the second insulation pattern 104 may cover the whole first insulation pattern 102 or may cover a side portion of the first insulation pattern 102. The second insulation pattern 104 may also be formed into such a structure that a side portion of the first insulation pattern 102 makes contact therewith. A structure between the first and second insulation patterns 102 and 104 may be varied in accordance with processes for forming the first and second insulation patterns 102 and 104, as would be known to one of the ordinary skill in the art.

The first insulation pattern 102 is formed to a thickness of about 4,000 Å to about 10,000 Å, and preferably formed to a thickness of about 6,000 Å to about 8,000 Å. When the thickness of the first insulation pattern 102 is less than about 4,000 Å, an electrical field intensity at a corner portion of the gate electrode 106 is not sufficiently reduced, and when the thickness of the first insulation pattern 102 is more than about 10,000 Å, the processing time and manufacturing costs for a transistor dramatically increases.

The second insulation pattern 104 is formed to a thickness of about 5,000 Å to about 15,000 Å, and preferably formed to a thickness of about 8,000 Å to about 12,000 Å. When the thickness of the second insulation pattern 104 is less than about 5,000 Å, the gate electrode 106 is not sufficiently electrically insulated from the source/drain regions 108, so that the gate electrode 106 and the source/drain regions 108 may have a short circuit with each other. When the thickness of the second insulation pattern 104 is more than about 15,000 Å, a step difference between the gate electrode 106 and the source/drain regions 108 is so large that a subsequent process is difficult to perform. The thickness of the first and second insulation patterns 102 and 104 is not limited to the above exemplary range, but rather various changes can be made by one skilled in the art in accordance with a voltage of electric power applied to the transistor.

The first end portion of the gate electrode 106 is formed on the first insulation pattern including the thermal oxide layer, and the second end portion of the gate electrode 106, which is opposite to the first end portion of the gate electrode 106, is formed on the second insulation pattern 104 including the CVD oxide layer. Particularly, when the second insulation layer 104 covers all of the first insulation pattern 102, the first end portion of the gate electrode 106 is formed on a first portion of the second insulation pattern 104 with which the first insulation pattern 102 makes contact, and the second end portion of the gate electrode 106 is formed on a second portion of the second insulation pattern 104 with which the substrate 100 makes contact. When the second insulation pattern 104 makes contact with a side portion of the first insulation pattern 102, the first portion of the gate electrode 106 is formed on the first insulation pattern 102 and the second portion of the gate electrode 106 is formed on the second insulation pattern 104. The gate electrode 106 is comprised of a conductive material such as polysilicon, and a channel region (not shown) in which a plurality of electrons or holes is positioned as charge carriers is formed in the substrate below the gate electrode 106. A polarity of the charge carriers is determined in accordance with a type of the HV transistor. When the HV transistor includes an n-channel MOS transistor, electrons function as the charge carriers, and when the HV transistor includes a p-channel MOS transistor, holes function as the charge carriers.

In the present exemplary embodiment, the first end portion of the gate electrode 106 is formed on the first insulation pattern 102 formed by a thermal oxidation process, so that an electrical field intensity at an edge portion of the gate electrode 106 is sufficiently reduced and hot carriers are minimized or prevented, thereby forming an HV transistor having a high breakdown voltage.

The source/drain regions 108 are formed at surface portions of the substrate 100. When the HV transistor is an n-channel MOS transistor, the source/drain regions 108 include N type impurities such as arsenic (As), phosphorus (P) and antimony (Sb). When the HV transistor is a p-channel MOS transistor, the source/drain regions 108 includes P type impurities such as boron (B), aluminum (Al), indium (In) and gallium (Ga).

The source/drain regions 108 are formed at a position spaced apart from the first insulation pattern 102 by a predetermined distance. For Example, the source/drain regions 108 are spaced apart from the first insulation pattern 102 by a distance of about 2 μm to about 8 μm, and preferably by a distance of about 3 μm to about 6 μm. In such a case, the first insulation pattern 102 has a length of about 1 μm to about 5 μm. An interval between the first insulation pattern 102 and the source/drain regions 108 and the length of the first insulation pattern 102 is not limited to the above exemplary range, but rather various changes can be made by one skilled in the art in accordance with a design rule of the transistor.

The HV transistor further includes a well region (not shown) formed on an upper portion of the substrate 100. The well region includes either the source region or the drain region 108. The well region may be overlapped with a portion of the second insulation pattern 104 including the CVD oxide layer, or may be overlapped with both a portion of the second insulation pattern 104 and a portion of the first insulation pattern 102. The well region prevents the hot carriers from being generated even though a high voltage no less than about 100V is applied to the source/drain regions 108 of the HV transistor, so that an electric short circuit between the gate electrode 106 and the source/drain regions 108 is sufficiently prevented by the well region. An electrical voltage between a source electrode and a drain electrode of the transistor is applied to the drain electrode of the transistor, so that the well region includes the drain region of the substrate. When the HV transistor is an n-channel MOS transistor, the well region includes N type impurities such as arsenic (As) and phosphorus (P). When the HV transistor is a p-channel MOS transistor, the well region includes P type impurities such as boron (B). In the present exemplary embodiment, the impurity concentration of the well region is lower than that of the source/drain regions 108.

Hereinafter, a method of manufacturing the above HV transistor shown in FIG. 2 is disclosed with reference to the accompanying drawings.

FIGS. 3 to 7 are cross sectional views illustrating processing steps for a method of manufacturing the high voltage transistor shown in FIG. 2.

Figure 3:
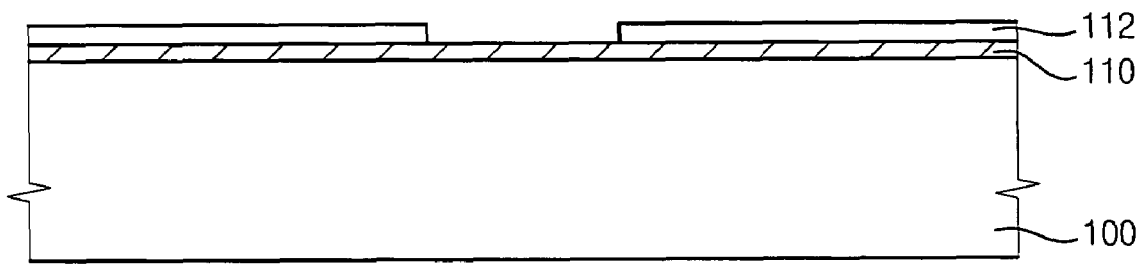
FIGS. 3 to 7 are cross sectional views illustrating processing steps for a method of manufacturing the high voltage transistor shown in FIG. 2.

Referring to FIG. 3, a buffer oxide layer 110 is formed on the substrate 100 and a nitride layer (not shown) is formed on the buffer oxide layer 110. The buffer oxide layer 110 prevents the substrates from being damaged due to stress caused by a difference of thermal expansion between the substrate 100 and the nitride layer, so that the buffer oxide layer 110 functions as a stress buffer for the substrate 100. A photoresist layer (not shown) is formed on the nitride layer and is patterned into a photoresist pattern (not shown) through which the nitride layer is partially exposed. Then, the nitride layer is partially etched away using the photoresist pattern as an etching mask, thereby forming a nitride pattern 112 through which the buffer oxide layer 110 is partially exposed.

Figure 4:
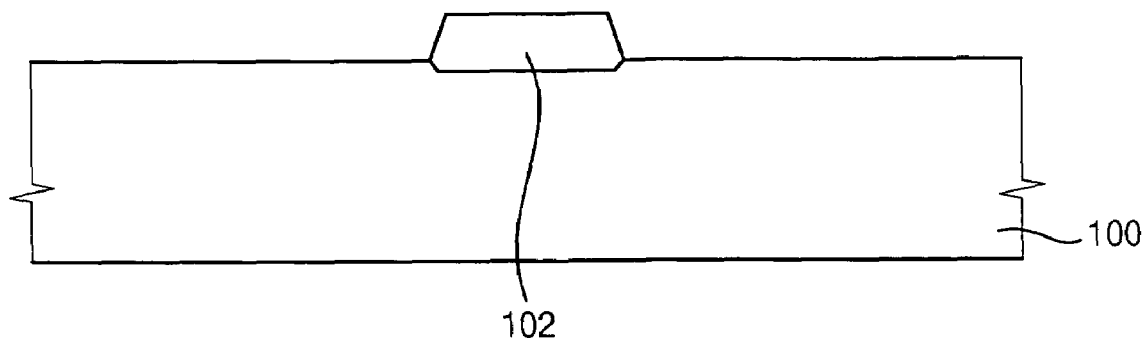

Referring to FIG. 4, a thermal oxidation process is performed on the exposed buffer oxide layer 110, thereby forming a first insulation pattern 102. For example, the thermal oxidation process is preferably performed at a temperature of about 700° C. to about 1,400° C. and in an oxidation atmosphere because when the thermal oxidation process is performed at a temperature below about 700° C., the oxidation process may be not sufficiently performed, and when the thermal oxidation process is performed at a temperature above about 1,400° C., the transistor may be deteriorated due to heat. Thereafter, the buffer oxide layer 110 and the nitride pattern 112 are removed from the substrate 100, thereby forming the first insulation pattern 102.

Figure 5:
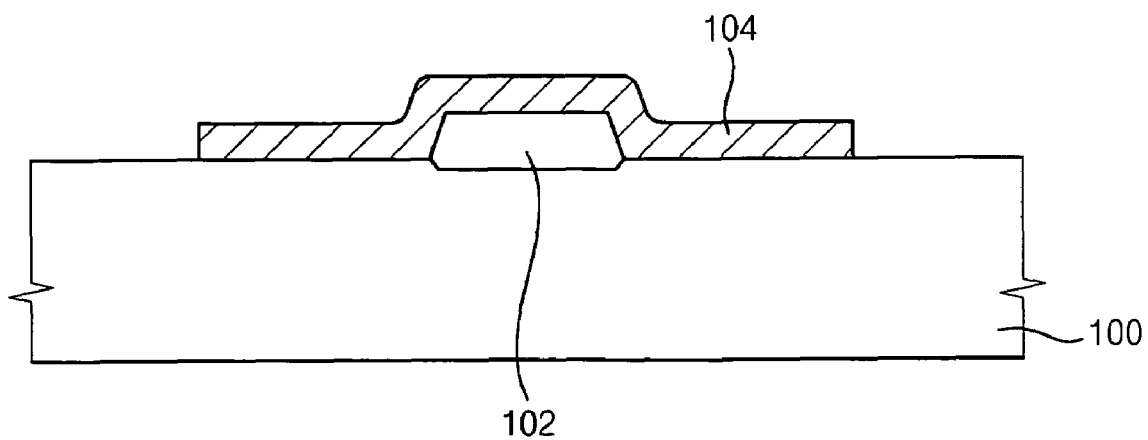

Referring to FIG. 5, the second insulation pattern 104 is formed by a CVD process. A second insulation layer (not shown) is formed on the substrate 100 to a sufficient thickness to cover the first insulation pattern 102 by a CVD process, and a photoresist pattern (not shown) is formed on the second insulation layer. The second insulation layer is partially etched away using the photoresist pattern as an etching mask, thereby forming the second insulation pattern 104 that covers the first insulation pattern 102. The second insulation layer is etched using an etchant including hydrogen fluoride (HF) so as to protect the substrate 100 during the etching process.

Figure 6:
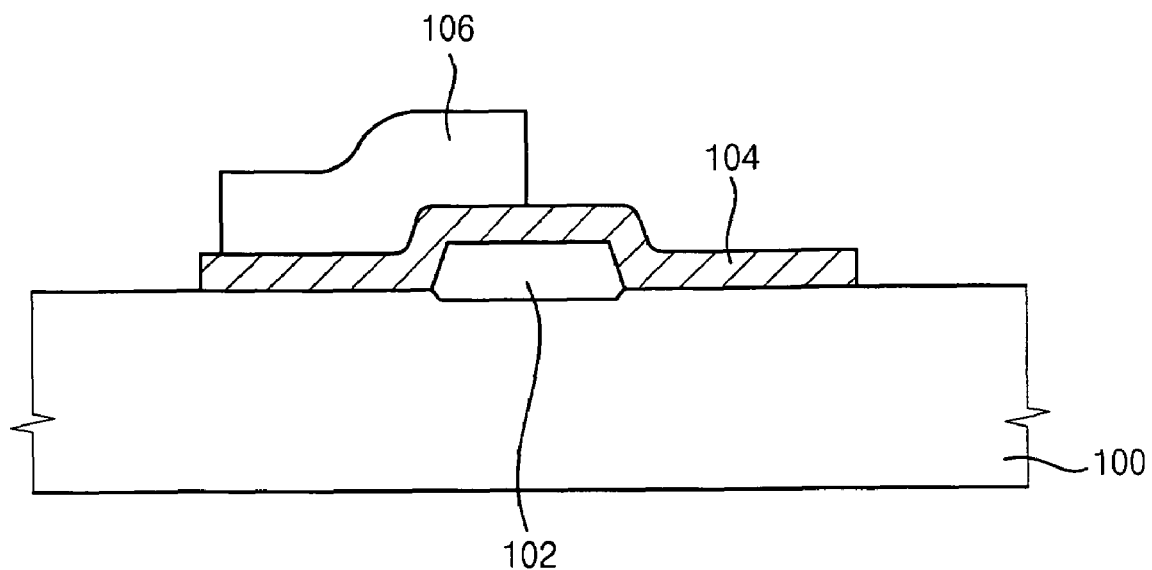

Referring to FIG. 6, a conductive material such as polysilicon is deposited onto a predetermined portion of the second insulation pattern 104, thereby forming a gate conductive layer (not shown) on a resultant structure formed on the substrate 100. A photoresist pattern (not shown) is formed on the gate conductive layer, and the gate conductive layer is etched using the photoresist pattern as an etching mask, thereby forming a gate electrode 106. A first end portion of the gate electrode 106 is formed on a first portion of the second insulation pattern 104 with which the first insulation pattern 102 makes contact, and a second end portion of the gate electrode 106, which is opposite to the first end portion of the gate electrode 106, is formed on a second portion of the second insulation pattern 104 with which the substrate 100 makes contact. Accordingly, one of the end portions of the gate electrode 106 for the HV transistor is formed on the first insulation pattern 102 formed by a thermal oxidation process, so that the electric field intensity at an edge portion of the gate electrode 106 is sufficiently reduced. As a result, hot carriers caused by the high electric field intensity are suppressed, thereby increasing a breakdown voltage of the HV transistor of the present embodiment.

Figure 7:
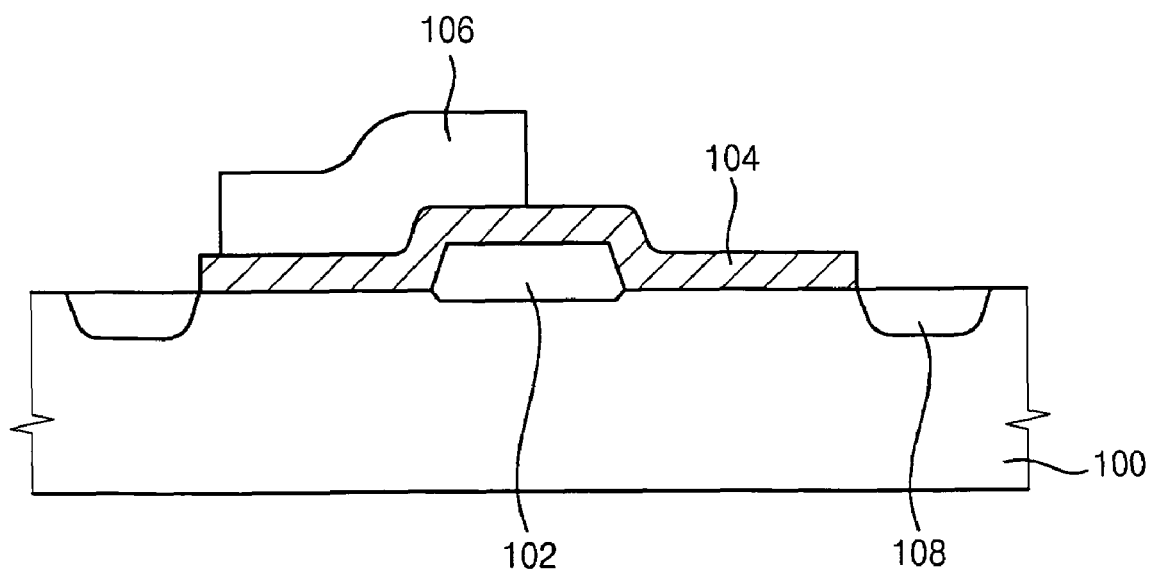

Referring to FIG. 7, impurities are implanted at surface portions of the substrate 100, thereby forming the source/drain regions 108. When the HV transistor is an n-channel MOS transistor, the source/drain regions 108 include N type impurities such as arsenic (As), phosphorus (P) and antimony (Sb). When the HV transistor is a p-channel MOS transistor, the source/drain regions 108 include P type impurities such as boron (B), aluminum (Al), indium (In) and gallium (Ga). Thereafter, various subsequent processes are performed on the resultant structure formed on the substrate 100, thereby forming the HV transistor of which a breakdown voltage is high.

Embodiment 2

Figure 8:
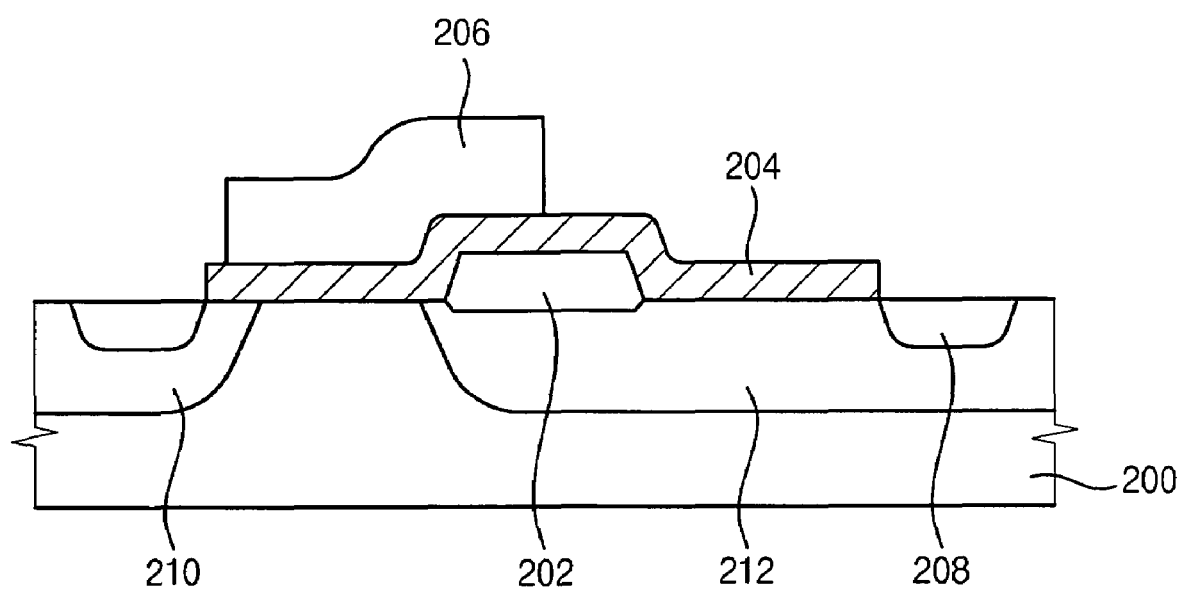
FIG. 8 is a cross sectional view illustrating a high voltage transistor according to a second exemplary embodiment of the present invention.

FIG. 8 is a cross sectional view illustrating a high voltage transistor according to a second example embodiment of the present invention.

Referring to FIG. 8, the HV transistor according to the second exemplary embodiment of the present invention includes a semiconductor substrate 200, a first well region 210 formed at the substrate 200 and including first impurities, a second well region 212 adjacent to the first well region 210 and including second impurities, a thermal oxide pattern 202 on the substrate 200 between the first and second well regions 210 and 212, a CVD oxide pattern 204 covering the thermal oxide pattern 202, a gate electrode on the thermal oxide pattern 202 and the CVD oxide pattern 204 and source/drain regions 208 formed at surface portions of the substrate 200.

The first well region 210 is formed at an upper portion of the substrate 200 and includes the source/drain regions 208. The first well region 210 is overlapped with a predetermined portion of the CVD oxide pattern 204 and/or the thermal oxide pattern 202. The first well region 210 controls a threshold voltage of the HV transistor, so that the first well region 210 includes the source region opposite to the drain region because an electrical power is applied to a drain electrode of the HV transistor. Accordingly, a control of the impurity concentration at the source region determines the threshold voltage of the HV transistor. When the HV transistor is an n-channel MOS transistor, the first well region 210 includes P type impurities such as boron (B). When the HV transistor is a p-channel MOS transistor, the first well region 210 includes N type impurities such as arsenic (As) and phosphorus (P).

The second well region 212 is also formed at the upper portion of the substrate 200 adjacent to the first well region 210, and includes the source/drain regions 208. Particularly, the second well region 212 is opposite to the first well region 210 with respect to the gate electrode 206, and is overlapped with a predetermined portion of the CVD pattern 204 or with the CVD oxide pattern 204 and a predetermined portion of the thermal oxide pattern 202. The second well region 212 prevents the hot carriers from being generated even though a high voltage power no less than about 100V is applied to the source/drain regions 108 of the HV transistor, so that an electric short circuit between the gate electrode 206 and the source/drain regions 208 is sufficiently prevented by the first well region 210. An electrical voltage between a source electrode and a drain electrode is applied to the drain electrode of the HV transistor, so that the second well region 212 includes the drain region of the substrate 200. When the HV transistor is an n-channel MOS transistor, the second well region 212 includes N type impurities such as arsenic (As), phosphorus (P) and antimony (Sb). When the HV transistor is a p-channel MOS transistor, the second well region 212 includes P type impurities such as boron (B), aluminum (Al), indium (In) and gallium (Ga). In the present exemplary embodiment, impurity concentration of the second well region 212 is lower than that of the source/drain region 208.

The thermal oxide pattern 202 is sufficiently covered with the CVD thermal oxide pattern 204. In particular, a thermal oxidation process is performed on the substrate 200 between the first and second well regions 210 and 212, thereby forming the thermal oxide pattern 202. Then, a chemical vapor deposition (CVD) process is performed on the thermal oxide pattern 202, thereby forming the CVD oxide pattern 204 sufficiently covering the thermal oxide pattern 202. The thermal oxide pattern 202 and the CVD oxide pattern 204 are the same as the first insulation pattern and the second insulation pattern, respectively, so any further description on the thermal oxide pattern 202 and the CVD oxide pattern 204 will be omitted hereinafter.

The gate electrode 206 includes a first end portion formed on a first portion of the CVD oxide pattern 204 with which the thermal oxide pattern 202 makes contact and a second end portion formed on a second portion of the CVD oxide pattern 204 that is opposite to the first portion of the CVD oxide portion and which makes contact with the substrate 200. Accordingly, the first end portion of the gate electrode 206 is formed on a top surface of the first portion of the CVD oxide pattern 204 and the second portion of the gate electrode 206 is formed on a top surface of the second portion of the CVD oxide pattern 204.

A channel region (not shown) including a plurality of electrons or holes as charge carriers is formed in the substrate 200 below the gate electrode 206. A polarity of the charge carriers is determined in accordance with a type of the HV transistor. The first end portion of the gate electrode 206 is formed on the thermal oxide pattern 202, so that an electrical field intensity at an edge portion of the gate electrode 206 is sufficiently reduced and hot carriers caused by high electric field intensity are minimized or prevented, thereby forming an HV transistor having a high breakdown voltage.

The source/drain regions 208 are formed at surface portions of the substrate 200, and are included in the first and second well regions 210 and 212, respectively. In the present exemplary embodiment, the first well region 210 includes the source region and the second well region 212 includes the drain region.

Hereinafter, a method of manufacturing the above HV transistor shown in FIG. 8 is disclosed with reference to the accompanying drawings.

FIGS. 9 to 14 are cross sectional views illustrating processing steps for a method of manufacturing the high voltage transistor shown in FIG. 8.

Figure 9:
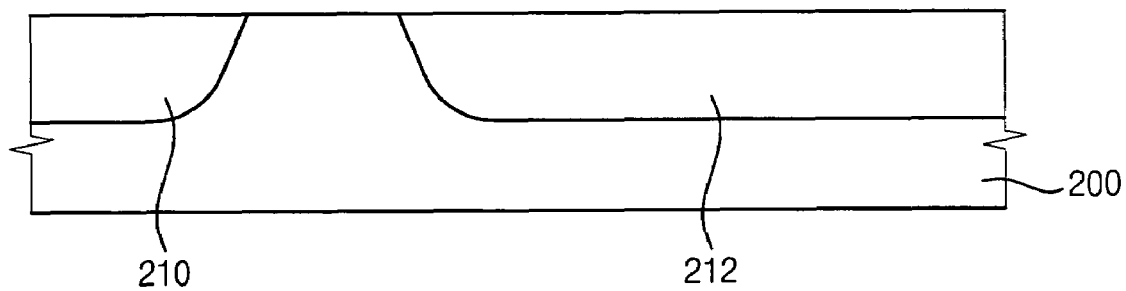
FIGS. 9 to 14 are cross sectional views illustrating processing steps for a method of manufacturing the high voltage transistor shown in FIG. 8.

Referring to FIG. 9, the first impurities are implanted at predetermined surface portions of the substrate 200, and the first well region 210 is formed on the substrate 200 through a photolithography process, an ion implantation process and a heat treatment at high temperature. The first well region 210 includes a source/drain region formed in a subsequent process, and controls a threshold voltage for the HV transistor. Electrical power is applied to a drain electrode of the HV transistor, so that the first well region 210 includes the source region opposite to the drain region. Accordingly, a control of the impurity concentration at the source region determines the threshold voltage of the HV transistor. When the HV transistor is an n-channel MOS transistor, the first well region 210 includes P type impurities such as boron (B). When the HV transistor is a p-channel MOS transistor, the first well region 210 includes N type impurities such as arsenic (As) and phosphorus (P). The first well region 210 may be overlapped with a portion of a CVD oxide pattern that is to be formed in a subsequent process, or may be overlapped with the CVD oxide pattern and a portion of a thermal oxide pattern that is to be formed in a subsequent process.

The second impurities are implanted at surface portions of the substrate 200 adjacent to the first well region 210, and the second well region 212 is formed on the substrate 200 through a photolithography process, an ion implantation process and a heat treatment at high temperature. The second well region 212 also includes the source/drain region 208 that is to be formed in a subsequent process. The second well region 212 includes the drain region of the substrate 200 because an electrical voltage between the source electrode and the drain electrode in the HV transistor is applied to the drain electrode. The second well region 212 prevents the hot carriers from being generated even though a high voltage power no less than about 100V is applied to the source/drain regions 208 of the HV transistor, so that an electric short circuit between the gate electrode 206 and the source/drain regions 208 is sufficiently prevented by the first well region 210. The second well region 212 is overlapped with a predetermined portion of the CVD pattern 204 that is to be formed in a subsequent process or with the CVD oxide pattern 204 and a predetermined portion of thermal oxide pattern 202. When the HV transistor is an n-channel MOS transistor, the second well region 212 includes N type impurities such as arsenic (As) and phosphorus (P). When the HV transistor is a p-channel MOS transistor, the second well region 212 includes P type impurities such as boron (B). In the present exemplary embodiment, impurity concentration of the second well region 212 is lower than that of the source/drain region 208.

The first well region 210 may be formed prior to the second well region 212, or the second well region 212 may be formed prior to the first well region 210, as would be known to one of the ordinary skill in the art.

Figure 10:
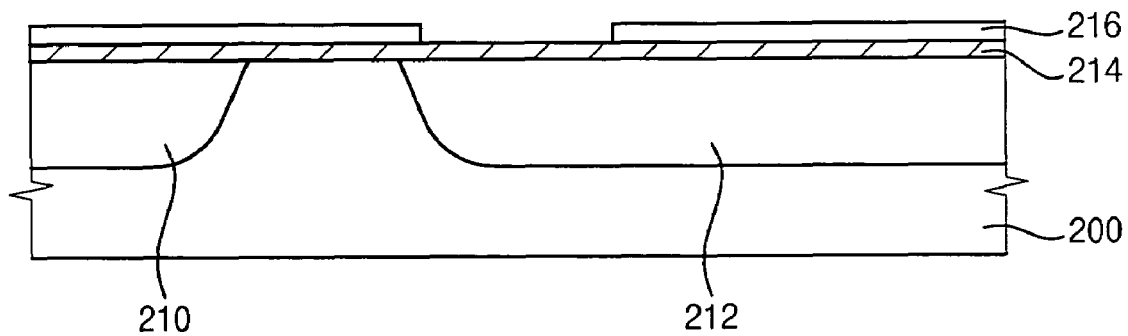
Figure 11:
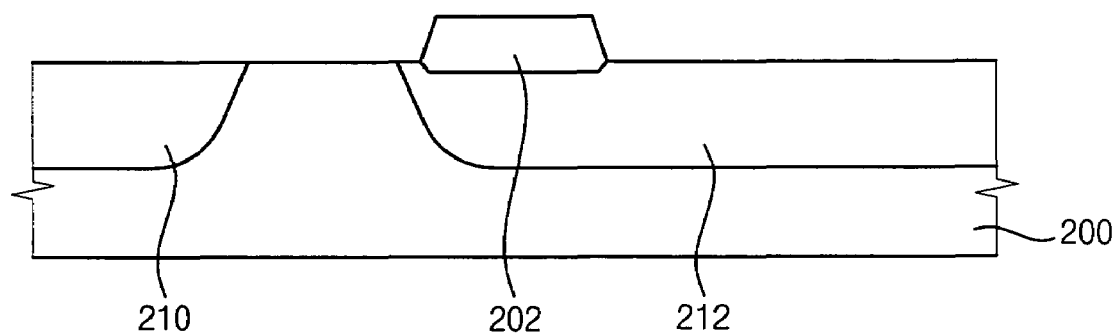

Referring to FIGS. 10 and 11, a thermal oxidation process is performed on a surface of the substrate between the first and second well regions 210 and 212, thereby forming a thermal oxide pattern 202.

The buffer oxide layer 214 is formed on the substrate 200 and the nitride layer 216 is partially formed on the buffer oxide layer 214 as shown in FIG. 10. Moreover, the thermal oxidation process is performed on the buffer oxide layer 214 exposed through the nitride layer 216, and the exposed buffer oxide layer 214 is transformed into a thermal oxide layer (not shown). Then, the buffer oxide layer 214 and the nitride layer 216 are removed from the substrate 200, thereby forming the thermal oxide pattern 202 as shown in FIG. 11. The process for forming the thermal oxide pattern is described above, so any further description will be omitted.

Figure 12:
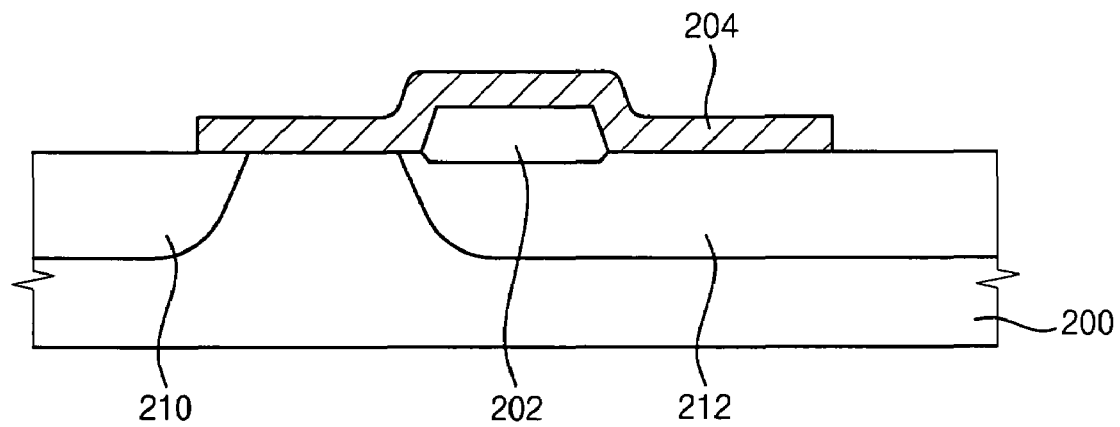

Referring to FIG. 12, the CVD oxide pattern 204 is formed on the substrate 200 and the thermal oxide pattern 202 by a CVD process. In particular, a CVD oxide layer (not shown) is formed on the thermal oxide pattern 202 and the substrate 200 by a CVD process, and is partially etched by an etching process, thereby forming the CVD oxide pattern 204. The process for forming the CVD oxide pattern is also described above, so any further description will be omitted to avoid any redundancy.

Figure 13:
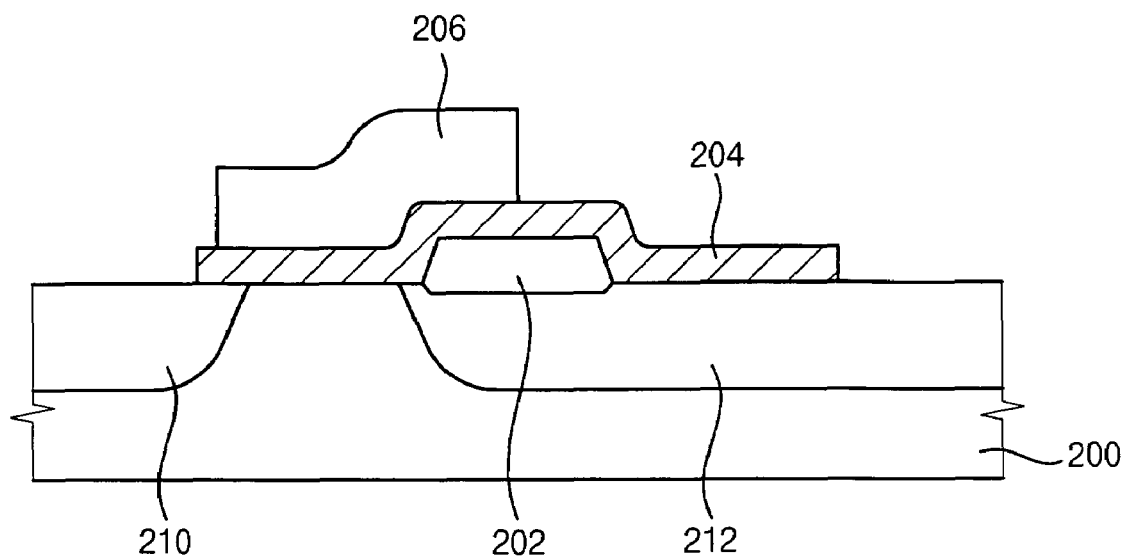

Referring to FIG. 13, a conductive material is deposited onto a predetermined portion of the CVD oxide pattern 204, thereby forming a gate conductive layer (not shown) on a resultant structure formed on the substrate 200. A photoresist pattern (not shown) is formed on the gate conductive layer, and the gate conductive layer is etched using the photoresist pattern as an etching mask, thereby forming a gate electrode 206 on the CVD oxide pattern 204. A first end portion of the gate electrode 206 is formed on a first portion of the CVD oxide pattern 204 with which the thermal oxide pattern 202 makes contact, and a second end portion of the gate electrode 206, which is opposite to the first end portion of the gate electrode 206, is formed on a second portion of the CVD oxide pattern 204 with which the substrate 200 makes contact. Accordingly, one of the end portions of the gate electrode 206 for the HV transistor is formed on the thermal oxide pattern 202 formed by a thermal oxidation process, so that the electric field intensity at an edge portion of the gate electrode 206 is sufficiently reduced. As a result, hot carriers caused by the high electric field intensity are minimized or prevented, thereby forming an HV transistor having a high breakdown voltage.

Figure 14:
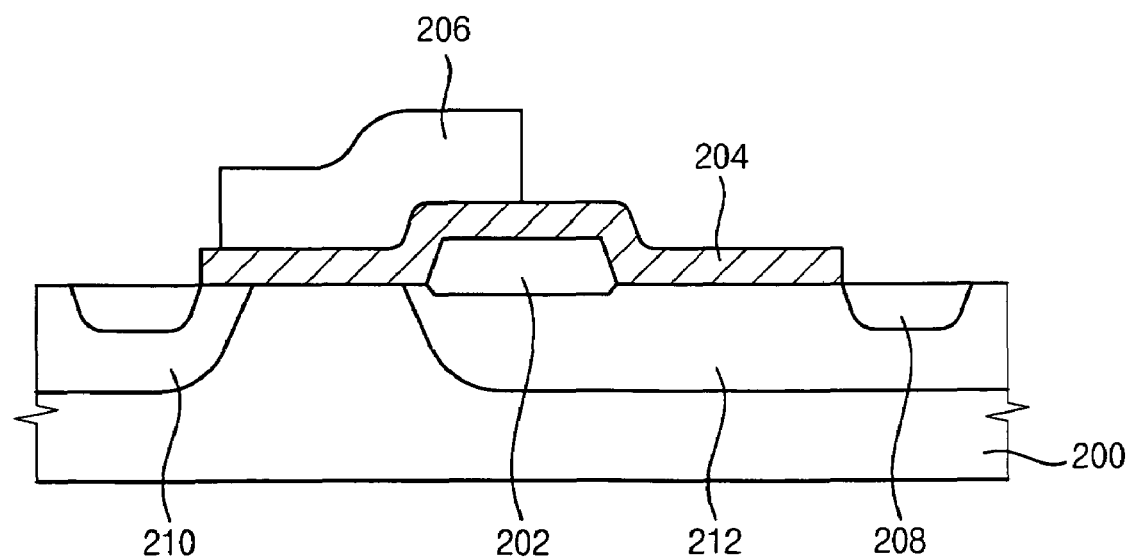

Referring to FIG. 14, third impurities are implanted at surface portions of the substrate 200 in the first and second well regions 210 and 212, thereby forming source/drain regions 208 in the first and second well regions 210 and 212. Thereafter, various subsequent processes are performed on the resultant structure formed on the substrate 200, thereby forming the HV transistor of which a breakdown voltage is high.

Embodiment 3

Figure 15:
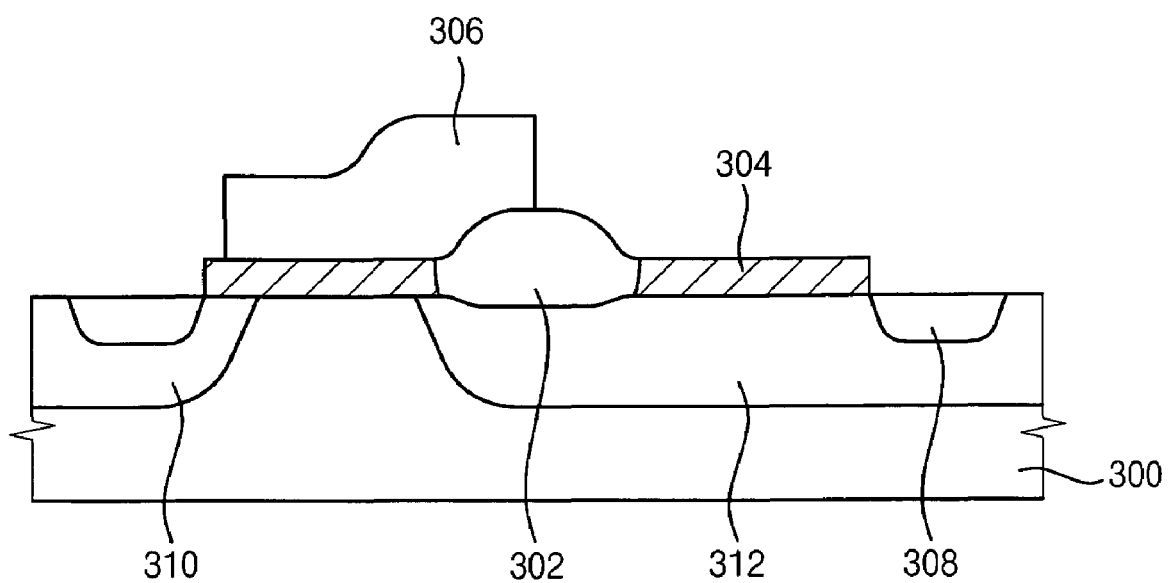
FIG. 15 is a cross sectional view illustrating a high voltage transistor according to a third exemplary embodiment of the present invention.

FIG. 15 is a cross sectional view illustrating a high voltage transistor according to a third exemplary embodiment of the present invention.

Referring to FIG. 15, the HV transistor includes a semiconductor substrate 300, a first well region 310 formed at the substrate 300 and including first impurities, a second well region 312 adjacent to the first well region 310 and including second impurities, a thermal oxide pattern 302 on the substrate 300 between the first and second well regions 310 and 312, a CVD oxide pattern 304 covering the thermal oxide pattern 302, a gate electrode 306 on the thermal oxide pattern 302 and the CVD oxide pattern 304 and source/drain regions 308 formed at surface portions of the substrate 300.

The thermal oxide pattern 302 is formed by a thermal oxidation process, and the CVD oxide pattern 304 is formed by a CVD process. Particularly, a CVD oxide layer (not shown) and a nitride layer (not shown) are sequentially formed on the substrate 300 by a CVD process, and a photoresist pattern (not shown) is formed on the nitride layer through a photolithography process. Then, the CVD oxide layer and the nitride layer are partially etched away using the photoresist pattern as an etching mask, thereby forming a CVD oxide pattern 304 and a nitride pattern (not shown) through which the substrate 300 is partially exposed. Then, a thermal oxidation process is performed on the exposed substrate 300, thereby forming a thermal oxide pattern 302 on the substrate 300. Then, the nitride pattern is removed from the substrate 300. Accordingly, the CVD oxide pattern 304 makes contact with the thermal oxide pattern 302 at sidewalls thereof.

The gate electrode 306 includes a first end portion formed on the thermal oxide pattern 302 and a second end portion formed on the CVD oxide pattern 304 that is opposite to the first portion of the CVD oxide portion. Accordingly, the first end portion of the gate electrode 306 is formed on the thermal oxide pattern 302, so that electrical field intensity at an edge portion of the gate electrode 306 is sufficiently reduced and hot carriers caused by a high electric field intensity are minimized or prevented from being generated. As a result, a HV transistor is formed having a high breakdown voltage.

Hereinafter, a method of manufacturing the above HV transistor shown in FIG. 15 is disclosed with reference to the accompanying drawings.

FIGS. 16 to 20 are cross sectional views illustrating processing steps for a method of manufacturing the high voltage transistor shown in FIG. 15.

Figure 16:
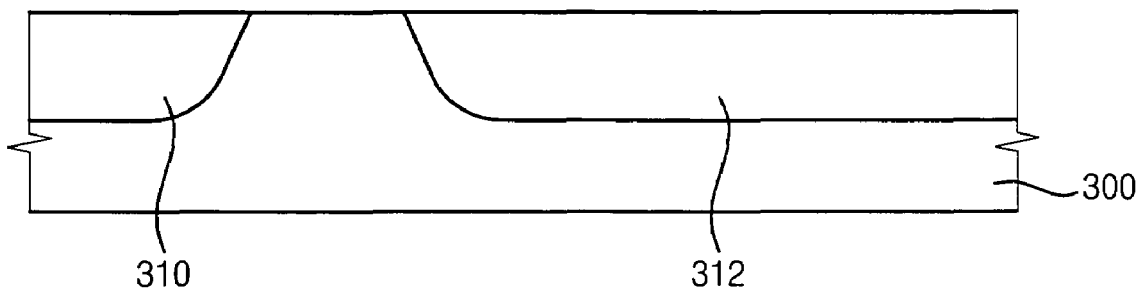
FIGS. 16 to 20 are cross sectional views illustrating processing steps for a method of manufacturing the high voltage transistor shown in FIG. 15.

Referring to FIG. 16, the first and second well regions 310 and 312 are formed on the substrate 300. In particular, first impurities are implanted at first surface portions of the substrate 300, thereby forming the first well region 310 on the substrate 300, and second impurities are implanted at second surface portions of the substrate 300 adjacent to the first surface portions, thereby forming the second well region 312.

The process for forming the first and second well regions 310 and 312 is described in exemplary embodiment 2, so any further description will be omitted to avoid any redundancy.

Figure 17:
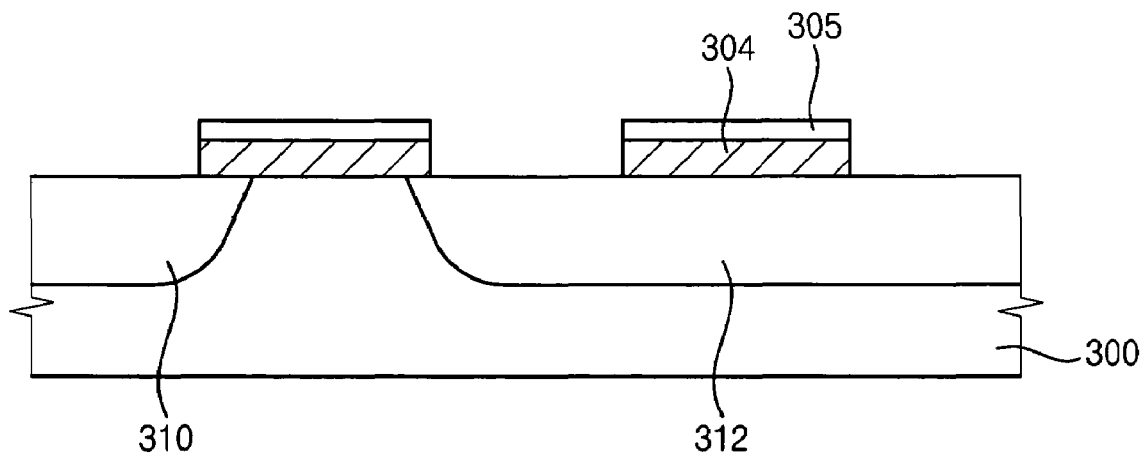

Referring to FIG. 17, the CVD oxide pattern 304 is formed on the substrate 300 including the first and second well regions 310 and 312. In particular, an oxide layer (not shown) and a nitride layer (not shown) are sequentially formed on the substrate 300 by a CVD process, and a photoresist pattern (not shown) is formed on the nitride layer. The CVD oxide layer and the nitride layer are sequentially etched away by a wet-etching or a dry-etching process using the photoresist pattern as an etching mask, thereby forming a CVD oxide pattern 304 and a nitride pattern 305 through which the substrate 300 is partially exposed.

Figure 18:
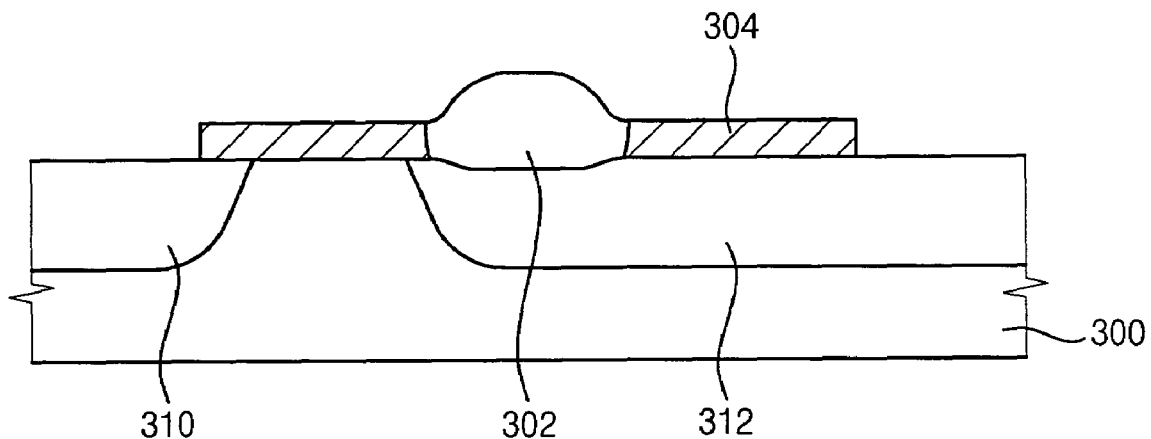

Referring to FIG. 18, a thermal oxidation process is performed on the substrate 300 exposed through the CVD oxide pattern 304, thereby forming a thermal oxide pattern 302 on the substrate 300. In the present embodiment, the thermal oxidation process is performed at a temperature of about 700° C. to about 1,400° C. in an oxidation atmosphere. Thereafter, the nitride pattern is removed from the substrate 300. The process for forming the thermal oxide pattern 302 using the thermal oxidation process is also described in exemplary embodiments 1 and 2, so any further description on the formation process for the thermal oxide pattern 302 will be omitted to avoid any redundancy.

Figure 19:
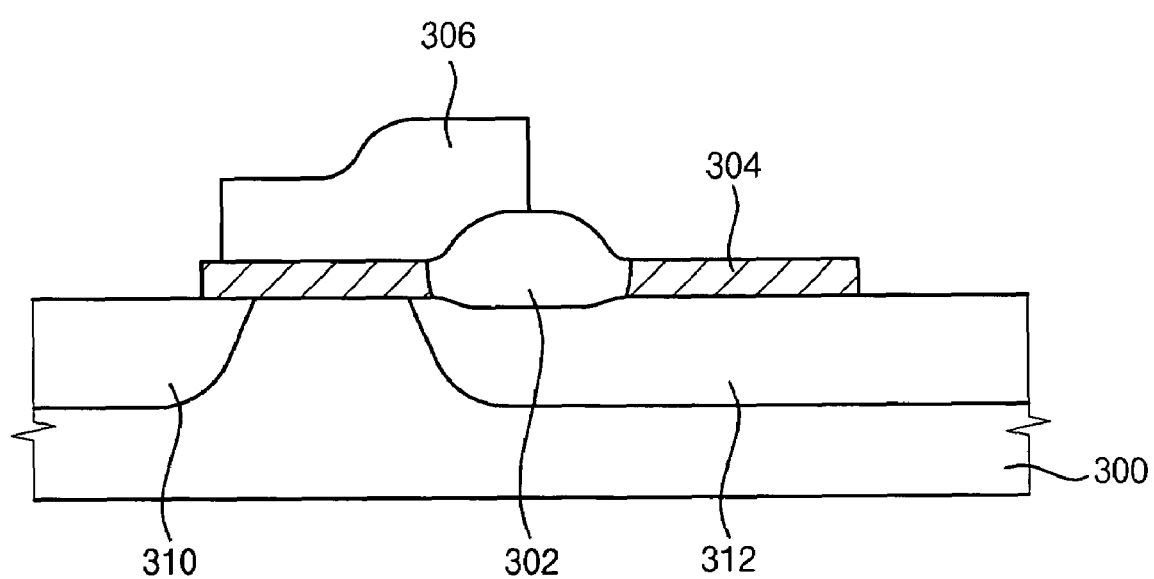

Referring to FIG. 19, a conductive material such as polysilicon is deposited onto a predetermined portion of the thermal oxide pattern 302 and the CVD oxide pattern 304, thereby forming a gate conductive layer (not shown) on the thermal oxide pattern 302 and the CVD oxide pattern 304. A photoresist pattern (not shown) is formed on the gate conductive layer, and the gate conductive layer is etched using the photoresist pattern as an etching mask, thereby forming a gate electrode 306 on the thermal oxide pattern 302 and the CVD oxide pattern 304. A first end portion of the gate electrode 306 is formed on the thermal oxide pattern 302, and a second end portion of the gate electrode 306 is formed on the CVD oxide pattern 304. Accordingly, one of the end portions of the gate electrode 306 for the HV transistor is formed on the thermal oxide pattern 302 formed by a thermal oxidation process, so that the electric field intensity at an edge portion of the gate electrode 306 is sufficiently reduced. As a result, hot carriers caused by the high electric field intensity are minimized or prevented, thereby forming an HV transistor having a high breakdown voltage.

Figure 20:
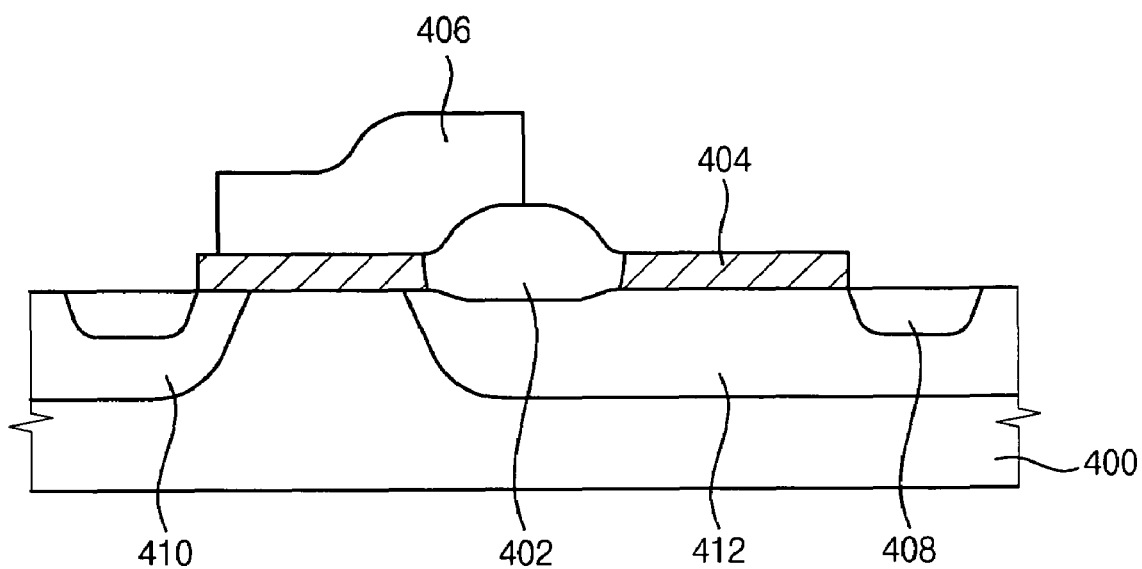

Referring to FIG. 20, third impurities are implanted at surface portions of the substrate 300 in the first and second well regions 310 and 312, thereby forming source/drain regions 308 in the first and second well regions 310 and 312. Thereafter, various subsequent processes are performed on the resultant structure formed on the substrate 300, thereby forming the HV transistor of which a breakdown voltage is high.

Embodiment 4

Figure 21:
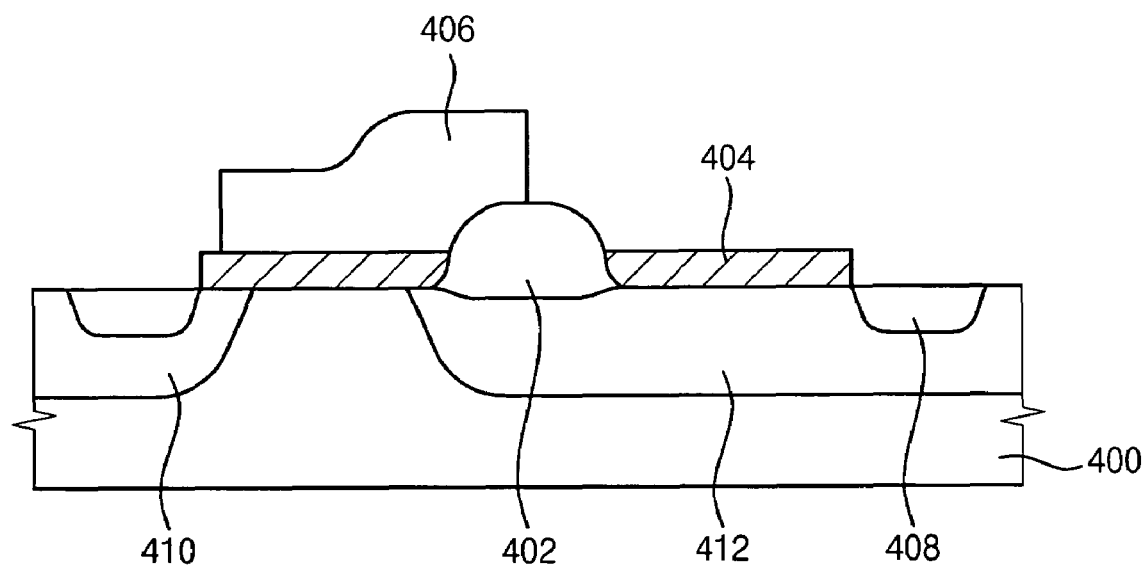
FIG. 21 is a cross sectional view illustrating a high voltage transistor according to a fourth exemplary embodiment of the present invention.

FIG. 21 is a cross sectional view illustrating a high voltage transistor according to a fourth exemplary embodiment of the present invention.

Referring to FIG. 21, the HV transistor includes a semiconductor substrate 400, a first well region 410 formed at the substrate 400 and including first impurities, a second well region 412 adjacent to the first well region 410 and including second impurities, a thermal oxide pattern 402 on the substrate 400 between the first and second well regions 410 and 412, a CVD oxide pattern 404 covering the thermal oxide pattern 402, a gate electrode 406 on the thermal oxide pattern 402 and the CVD oxide pattern 404 and source/drain regions 408 formed at surface portions of the substrate 400.

The thermal oxide pattern 402 is formed by a thermal oxidation process, and the CVD oxide pattern 404 is formed by a CVD process. Particularly, a CVD oxide layer (not shown) and a nitride layer (not shown) are sequentially formed on the substrate 400 by a CVD process, and a photoresist pattern (not shown) is formed on the nitride layer through a photolithography process. Then, the CVD oxide layer and the nitride layer are partially etched away using the photoresist pattern as an etching mask, thereby forming a CVD oxide pattern 404 and a nitride pattern (not shown) through which the substrate 400 is partially exposed. Then, a thermal oxidation process is performed on the exposed substrate 400, thereby forming a thermal oxide pattern 402 on the substrate 400. Then, the nitride pattern is removed from the substrate 400. Accordingly, the CVD oxide pattern 404 makes contact with the thermal oxide pattern 402 at sidewalls thereof.

The gate electrode 406 includes a first end portion formed on the thermal oxide pattern 402 and a second end portion formed on the CVD oxide pattern 404 that is opposite to the first portion of the CVD oxide pattern 404. Accordingly, the first end portion of the gate electrode 406 is formed on the thermal oxide pattern 402, so that an electrical field intensity at an edge portion of the gate electrode 406 is sufficiently reduced and hot carriers caused by high electric field intensity are minimized or prevented. As a result, an HV transistor is formed to have a high breakdown voltage.

Hereinafter, a method of manufacturing the above HV transistor shown in FIG. 21 is disclosed with reference to the accompanying drawings.

FIGS. 22 to 27 are cross sectional views illustrating processing steps for a method of manufacturing the high voltage transistor shown in FIG. 21.

Figure 22:
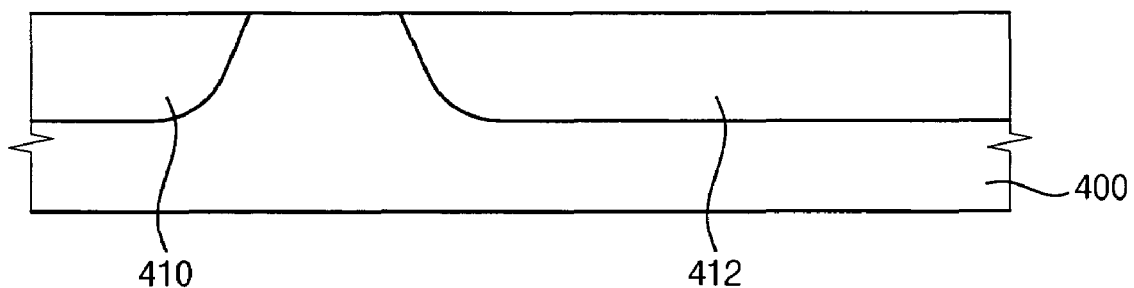
FIGS. 22 to 27 are cross sectional views illustrating processing steps for a method of manufacturing the high voltage transistor shown in FIG. 21.

Referring to FIG. 22, the first and second well regions 410 and 412 are formed on the substrate 400. In particular, first impurities are implanted at first surface portions of the substrate 400, thereby forming the first well region 410 on the substrate 400, and second impurities are implanted at second surface portions of the substrate 400 adjacent to the first surface portions, thereby forming the second well region 412 on the substrate 400. The process for forming the first and second well regions 410 and 412 is described in the above exemplary embodiments, so any further description will be omitted to avoid any redundancy.

Figure 23:
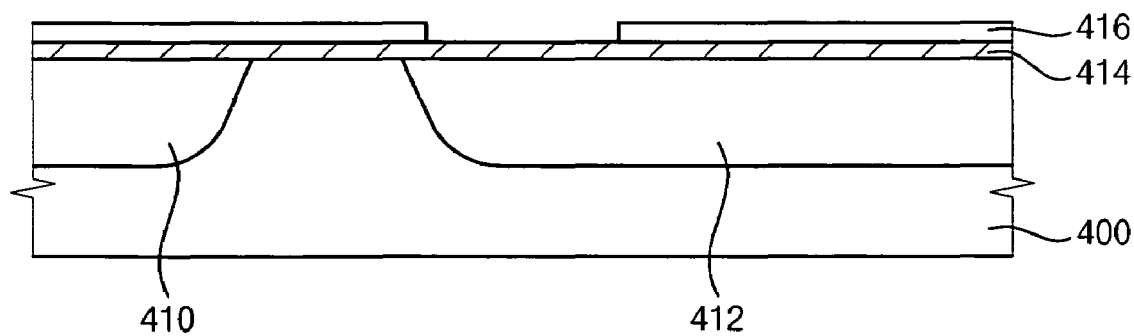
Figure 24:
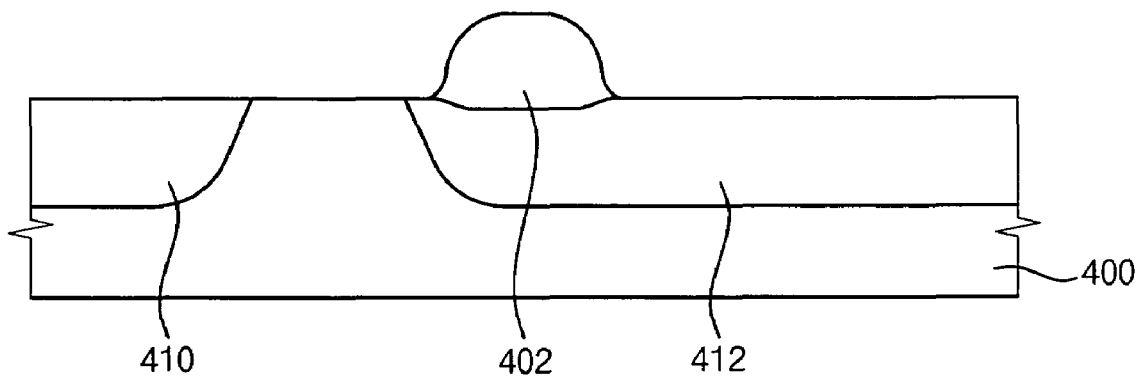

Referring to FIGS. 23 and 24, a thermal oxidation process is performed on a surface of the substrate 400 between the first and second well regions 410 and 412, and thus a thermal oxide pattern 402 is formed on the substrate 400.

A buffer oxide layer 414 is formed on the substrate 400 and a nitride layer 416 is partially formed on the buffer oxide layer 414 as shown in FIG. 23. The thermal oxidation process is performed on the buffer oxide layer 414 exposed through the nitride layer 416, and the exposed buffer oxide layer 414 is transformed into a thermal oxide layer (not shown). Then, the buffer oxide layer 414 and the nitride layer 416 are removed from the substrate 400, thereby forming the thermal oxide pattern 402 as shown in FIG. 24. The process for forming the thermal oxide pattern is described in the above exemplary embodiments, so any further description will be omitted.

Figure 25:
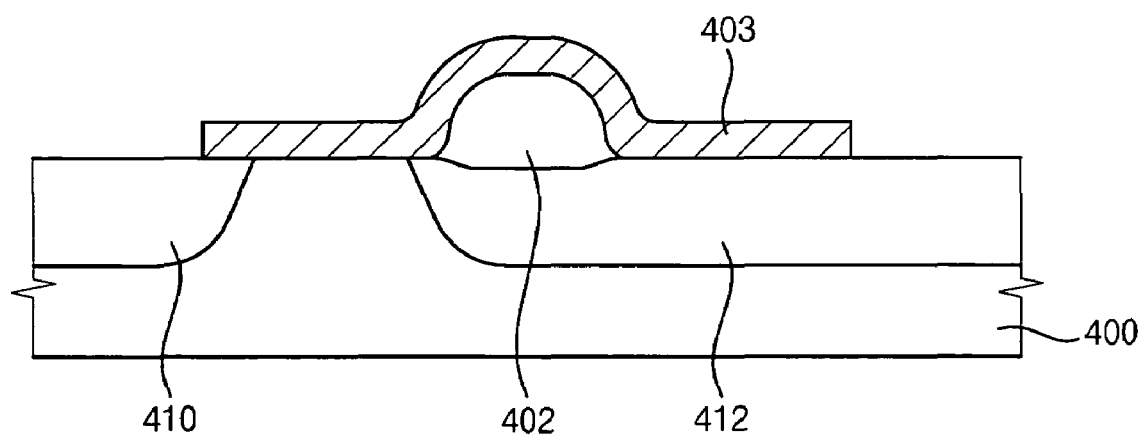

Referring to FIG. 25, an oxide layer 403 is formed on the thermal oxide pattern 402 and the substrate 400 by a CVD process.

Figure 26:
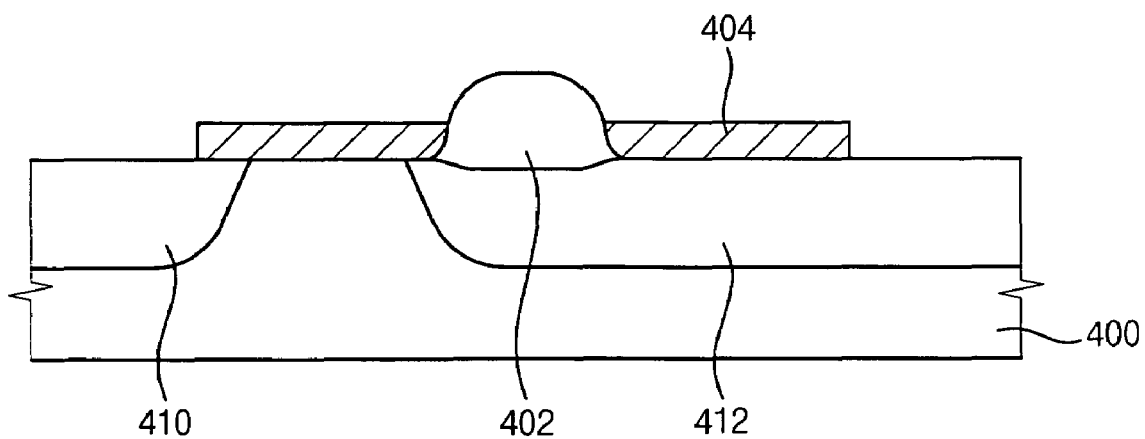

Referring to FIG. 26, a photoresist pattern (not shown) is formed on the oxide layer 403 by a photolithography process, and the oxide layer 403 is selectively removed by a wet-etching or a dry-etching process using the photoresist pattern as an etching mask, thereby forming a CVD oxide pattern 404 on the thermal oxide pattern 402.

Figure 27:
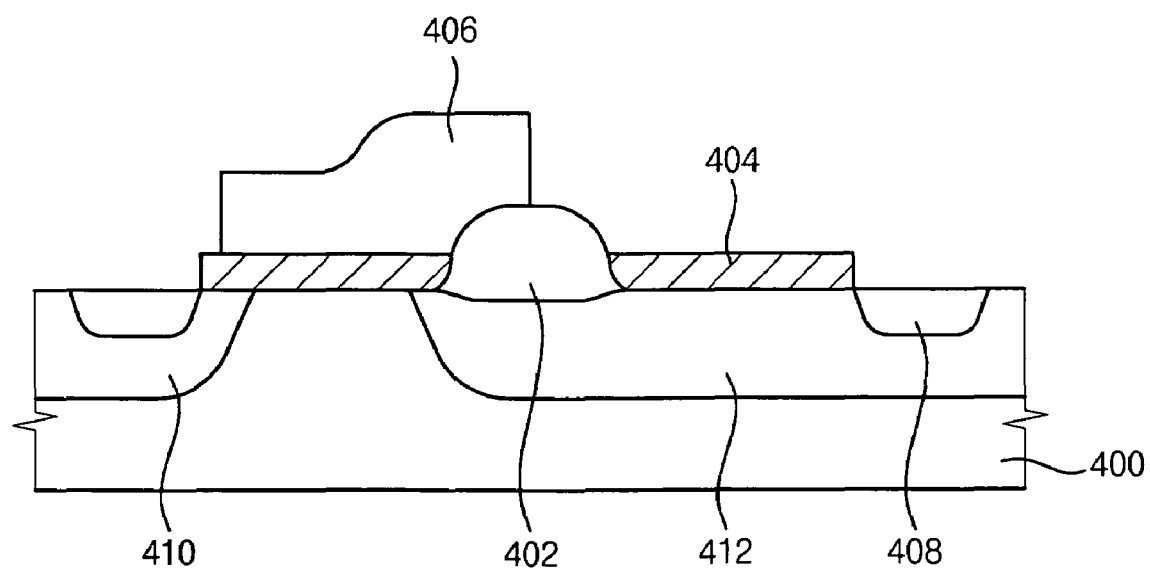

Referring to FIG. 27, a conductive material is deposited onto a predetermined portion of the thermal oxide pattern 402 and the CVD oxide pattern 404, thereby forming a gate conductive layer (not shown) on the thermal oxide pattern 402 and the CVD oxide pattern 404. A photoresist layer (not shown) is formed on the gate conductive layer and is patterned into a photoresist pattern (not shown) through which the gate conductive layer is partially exposed by a photolithography process. The gate conductive layer is etched using the photoresist pattern as an etching mask, thereby forming a gate electrode 406 on the thermal oxide pattern 402 and the CVD oxide pattern 404. A first end portion of the gate electrode 406 is formed on the thermal oxide pattern 402, and a second end portion of the gate electrode 406 is formed on the CVD oxide pattern 404. Accordingly, one of the end portions of the gate electrode 406 for the HV transistor is formed on the thermal oxide pattern 402 formed by a thermal oxidation process, so that the electric field intensity at an edge portion of the gate electrode 406 is sufficiently reduced. As a result, hot carriers caused by the high electric field intensity are minimized or prevented, thereby forming an HV transistor having a high breakdown voltage.

Then, third impurities are implanted at surface portions of the substrate 400 in the first and second well regions 410 and 412, thereby forming source/drain regions 408 in the first and second well regions 310 and 312. Thereafter, various subsequent processes are performed on the resultant structure formed on the substrate 400, thereby forming the HV transistor of which a breakdown voltage is high.

Experiments on Transistor Characteristics

Representative transistor characteristics were experimentally estimated using a sample transistor according to exemplary embodiments of the present invention and two comparative transistors.

<Sample Transistor>

Figure 28:
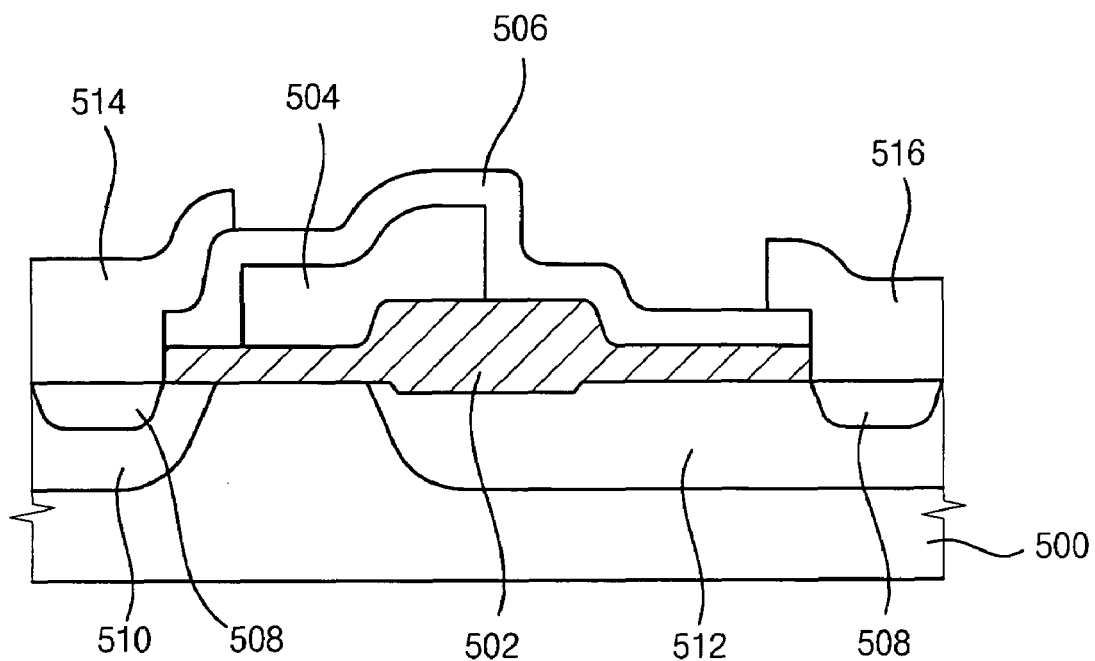
FIG. 28 is a cross sectional view illustrating the sample transistor manufactured in accordance with the same method as in Embodiment 2.

A p-channel MOS transistor was manufactured, in accordance with the same method as in exemplary embodiment 2, as the sample transistor. FIG. 28 is a cross sectional view illustrating the sample transistor manufactured in accordance with the same method as in exemplary embodiment 2. As shown in FIG. 28, a thermal oxide pattern was formed on a substrate 500 to a thickness of about 7,000 Å by a thermal oxidation process, and a CVD oxide pattern was formed on the thermal oxide pattern and the substrate 500 to a thickness of about 10,000 Å by a CVD process. As a result, a gate oxide pattern 502 including the thermal oxide pattern and the CVD oxide pattern was formed on the substrate 500. Then, a gate electrode 504 was formed on the gate oxide pattern 502 through the same process as in exemplary embodiment 2, and a passivation layer for protecting the gate electrode 504 was formed on the gate electrode 504 and on the gate oxide pattern 502. Boron (B) ions were implanted at surface portions of the substrate 500, thereby forming source/drain regions 508. A source electrode 514 of the sample transistor was formed in the source region, and a drain electrode 516 of the sample transistor was formed in the drain region. Processing conditions are listed in the following Table 1.

<Comparative Transistor 1>

Figure 29:
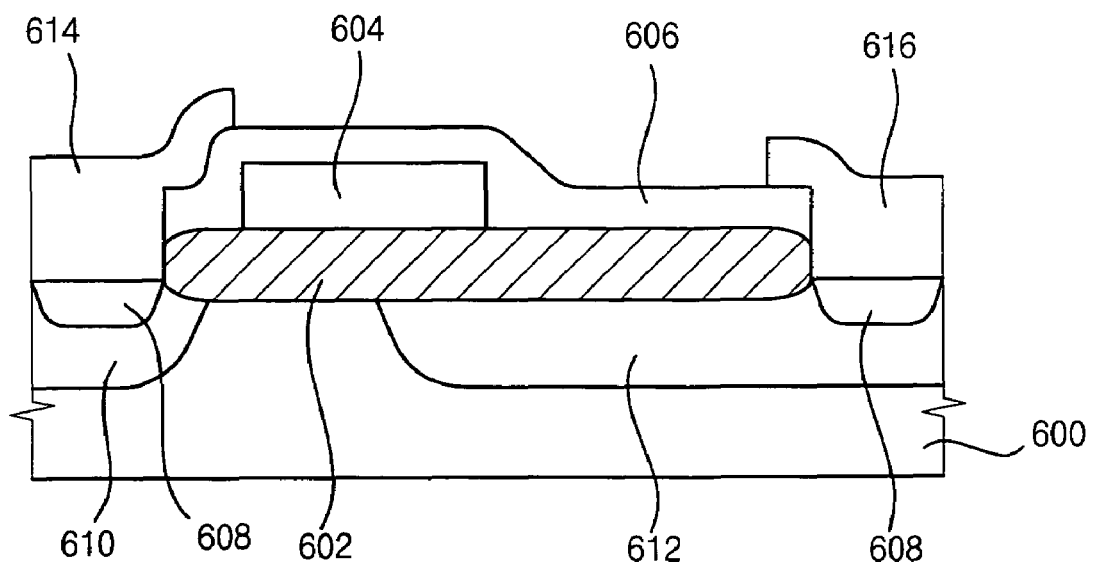
FIG. 29 is a cross sectional view illustrating the first comparative transistor of which a gate oxide pattern is formed only through a thermal oxidation process.

A p-channel MOS transistor was manufactured through a first comparative process in which a gate oxide pattern of the transistor was formed only through a thermal oxidation process as the first comparative transistor. FIG. 29 is a cross sectional view illustrating the first comparative transistor of which a gate oxide pattern is formed only through a thermal oxidation process. As shown in FIG. 29, a gate oxide pattern 602 was formed on a substrate 600 to a thickness of about 7,000 Å only by a thermal oxidation process, and the same processing steps for manufacturing a transistor as in exemplary embodiment 2 were performed on the substrate 600, thereby forming the first comparative transistor. Processing conditions for the first comparative transistor are also listed in the following Table 1.

<Comparative Transistor 2>

Figure 30:
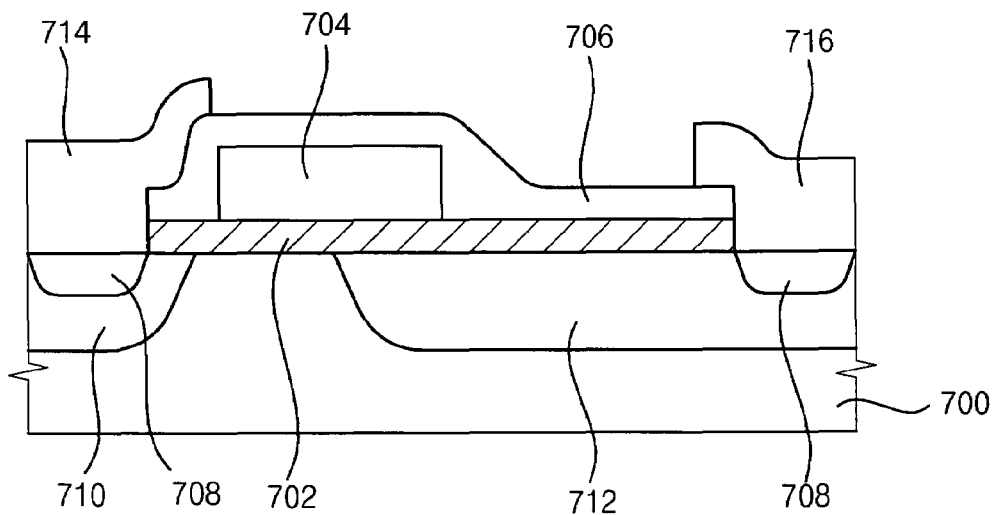
FIG. 30 is a cross sectional view illustrating the second comparative transistor of which a gate oxide pattern is formed only through a CVD process.

A p-channel MOS transistor was manufactured through a second comparative process in which a gate oxide pattern of the transistor was formed only through a CVD process as the second comparative transistor. FIG. 30 is a cross sectional view illustrating the second comparative transistor of which a gate oxide pattern is formed only through a CVD process. As shown in FIG. 30, a gate oxide pattern 702 was formed on a substrate 700 to a thickness of about 10,000 Å only by a CVD process, and the same processing steps for manufacturing a transistor as in exemplary embodiment 2 were performed on the substrate 700, thereby forming the second comparative transistor. Processing conditions for the second comparative transistor are also listed in the following Table 1.

TABLE 1

|  | Sample Transistor Thermal Oxide Pattern/ CVD Oxide Pattern | Comparative Transistor 1 Thermal Oxide Pattern | Comparative Transistor 1 CVD Oxide Pattern |
|---|---|---|---|
| Cell Pitch | 19 mm | 21 mm | 19 mm |
| Dosage for a P Well (B, 100 KeV) | $4.9 \times 10^{12}$ | $3.7 \times 10^{12}$ | $4.9 \times 10^{12}$ |
| Oxide Layer Thickness | 7,000 Å/10,000 Å | 7,000 Å | 10,000 Å |
| Threshold Voltage | 30 V | 30 V | 20 V |

<Estimation of Electric Field Intensity of a Transistor>

Figure 31:
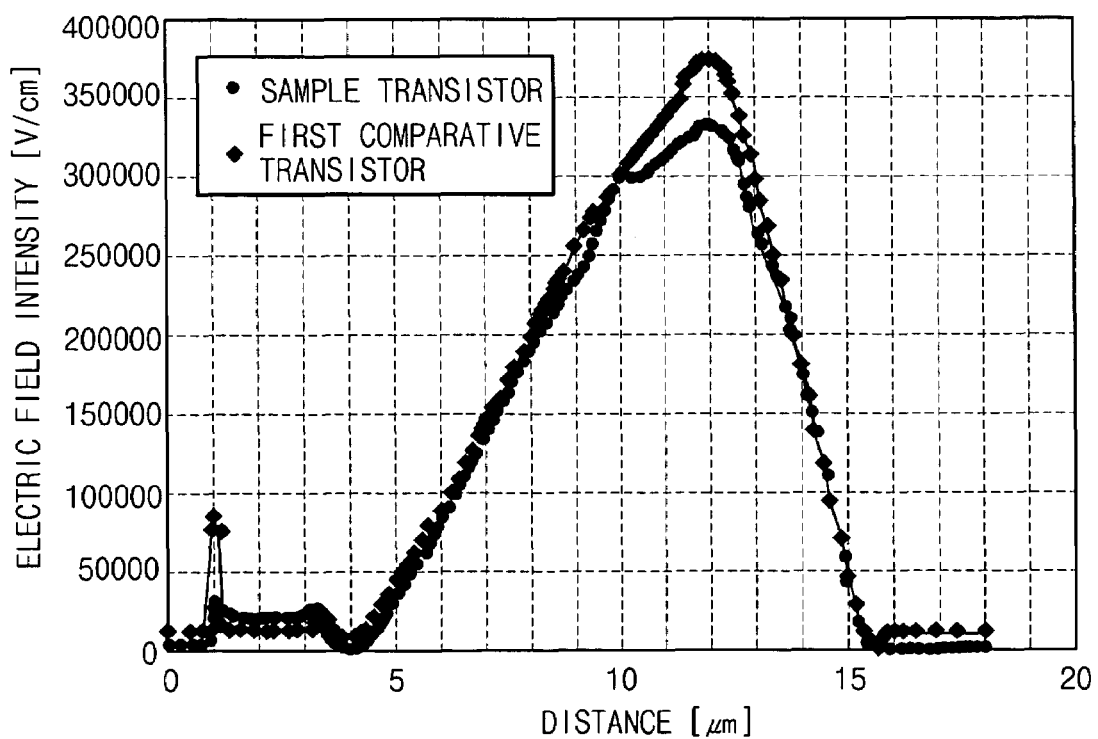
FIG. 31 is a graph illustrating an electric field intensity of the sample transistor and the first comparative transistor as a function of distance.

Electric field intensity was estimated with respect to the sample transistor and the first comparative transistor. FIG. 31 is a graph illustrating an electric field intensity of the sample transistor and the first comparative transistor as a function of distance. In FIG. 31, the electric field intensity is expressed in units of V/cm, and the distance is expressed in units of μm.

Referring to FIG. 31, the electric field intensity of the sample transistor is lower than that of the first comparative transistor by as much as about 50,000V/cm. That is, the above experimental results show that the electric field intensity is reduced when the gate oxide pattern includes the thermal oxide pattern and the CVD oxide pattern as compared to when the gate oxide pattern includes only the thermal oxide pattern. Accordingly, the transistor of exemplary embodiments of the present invention in which the gate oxide pattern includes the thermal oxide pattern and the CVD oxide pattern has a higher breakdown voltage due to reduction of the electric field intensity.

<Estimation of Electric Field Line Distribution of a Transistor>

Figure 32:
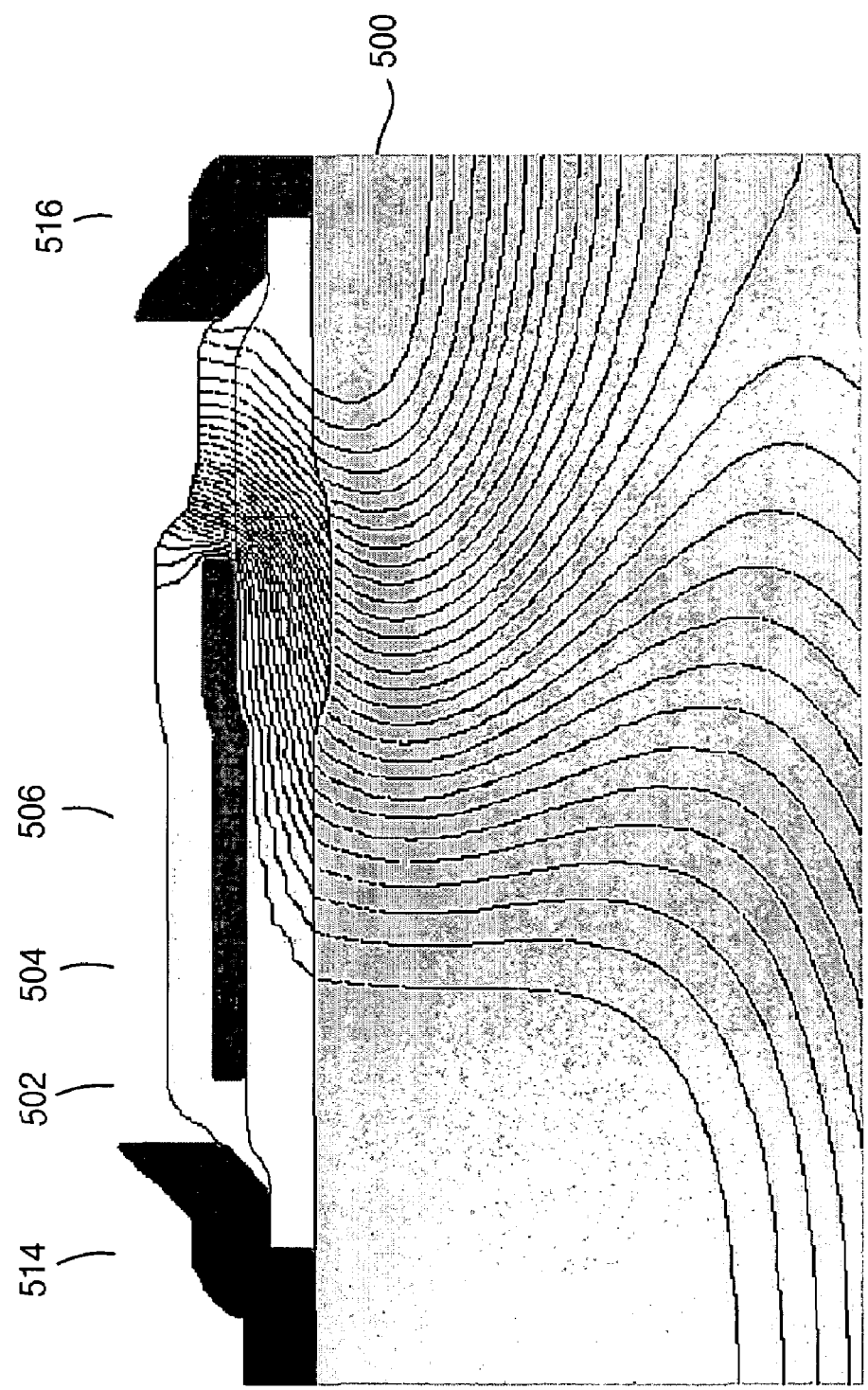
FIG. 32 is a view illustrating a voltage distribution of the sample transistor.
Figure 33:
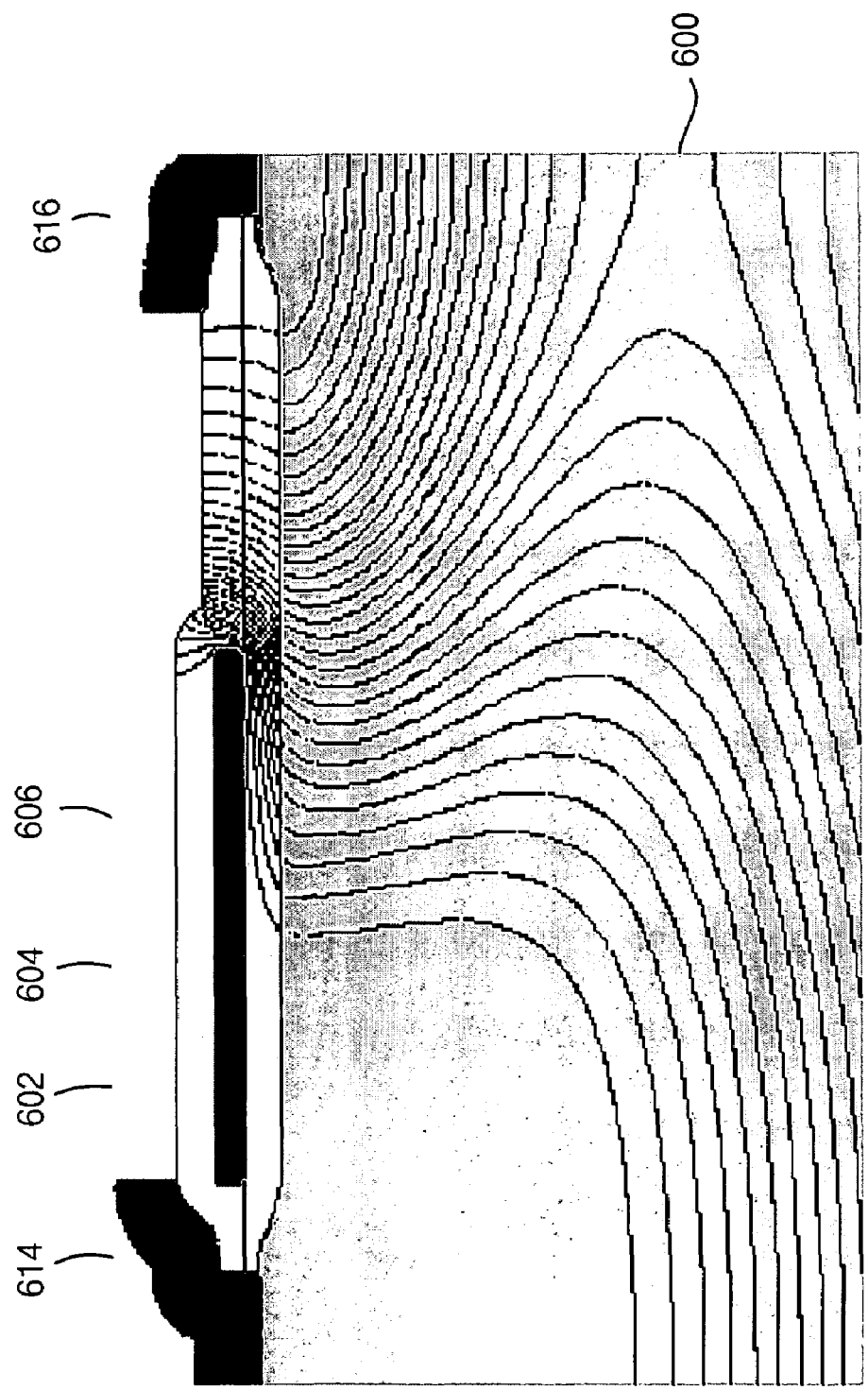
FIG. 33 is a view illustrating a voltage distribution of the first comparative transistor.
Figure 34:
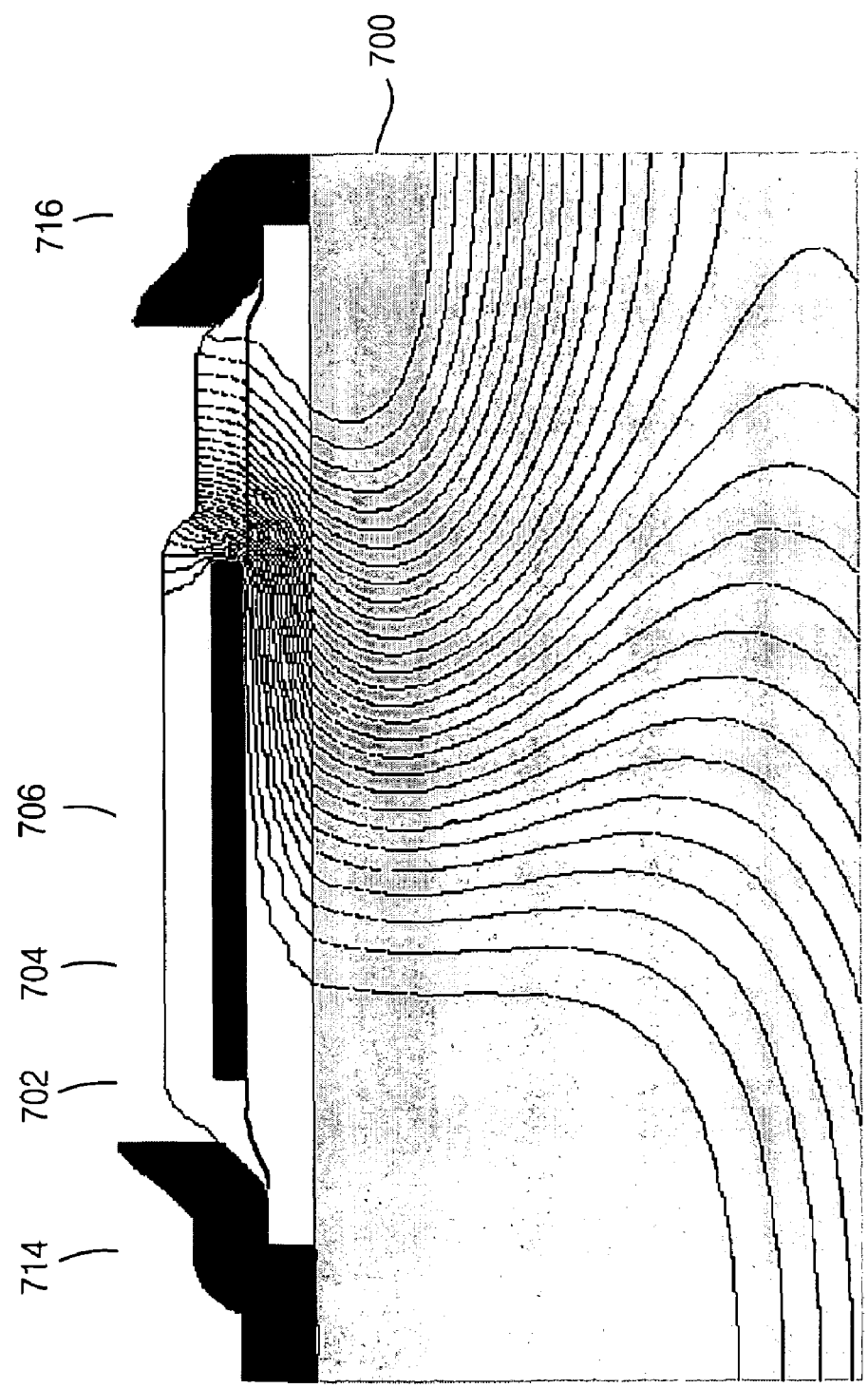
FIG. 34 is a view illustrating a voltage distribution of the second comparative transistor.

A drain voltage $V_{ds}$ of about −180V was applied between the source and drain electrodes of the sample transistor and the comparative transistors, and an electric field line distribution was estimated with respect to the sample transistor and the comparative transistors, respectively. FIG. 32 is a view illustrating a voltage distribution of the sample transistor, and FIG. 33 is a view illustrating a voltage distribution of the first comparative transistor. FIG. 34 is a view illustrating a voltage distribution of the second comparative transistor. An electric field line distribution indicates electrical characteristics of a transistor such as a relation between a channel current and a drain voltage and a breakdown voltage.

Referring to FIGS. 32 to 34, an electric field line density is higher at an edge portion of the gate electrodes 504, 604 and 704 adjacent to the drain region than any one else in the transistors. However, the experimental results show that the electric field line density of the first and second comparative transistors are much higher than that of the sample transistor at the edge portions of the gate electrode. That is, the electric field line density of the sample transistor is much lower as compared with the first and second comparative transistors, so that the electric field intensity of the sample transistor is much reduced at the edge portion of the gate electrode. When the electric field intensity is high at an edge portion of a gate electrode, a great number of hot carriers are generated from the gate electrode, so that insulation performance of the gate oxide pattern is severely deteriorated. Accordingly, the above experimental results confirm that the HV transistor of exemplary embodiments of the present invention may be operated without deterioration of the insulation performance even though a high voltage power is applied thereto because the electric field intensity is sufficiently reduced.

<Estimation of Breakdown Voltage of a Transistor>

A breakdown voltage of a transistor was estimated with respect to the sample transistor and the comparative transistors, and experimental results are listed in the following Table 2.

TABLE 2

|  | Sample Transistor | First Comparative Transistor | Second Comparative Transistor |
|---|---|---|---|
| Breakdown Voltage | 195 V | 188 V | 170 V |

As shown in Table 2, a breakdown voltage of the first comparative transistor is higher than that of the second comparative transistor because the thermal oxide pattern has a superior insulation property to the CVD oxide pattern. Furthermore, a breakdown voltage of the sample transistor is much higher than that of the first comparative transistor because an edge portion of the gate electrode of the sample transistor is comprised of the thermal oxide while any other portion of the gate electrode of the sample transistor is comprised of the CVD oxide. The thermal oxide at the edge portion of the gate electrode reduces an electric field intensity, so that hot carriers caused by the high electric field intensity at the edge portion of the gate electrode are prevented from being generated. As a result, an electrical short between the source and drain electrodes is sufficiently prevented, and thus the HV transistor of the present exemplary embodiment may be operated without breakdown even when a high electrical power of about 190V is applied thereto.

<Estimation of On-Resistance of a Transistor>

A gate voltage Vgs of about −130V was applied between the source and gate electrodes of the sample transistor and the comparative transistors, and a saturation current ($I_{dsat}$) was estimated at each surface of the channels of the sample transistor and the comparative transistors. Experimental results are listed in the following Table 3. A large saturation current indicates that an on-resistance of a transistor is small, and a small saturation current indicates that an on-resistance of a transistor is large. 'On-resistance' of a transistor denotes electrical resistance of a transistor when electric power is applied thereto.

TABLE 3

| | Sample Transistor | First Comparative Transistor | Second Comparative Transistor |
|---|---|---|---|
| Saturation Current | 137 µA/µm | 130 µA/µm | 137 µA/µm |

As shown in Table 3, the saturation current of the sample transistor and the second comparative transistor is larger than that of the first comparative transistor because the impurities in the well region are less exhausted when the gate electrode is comprised of the CVD oxide than when the gate electrode is comprised of the thermal oxide. Accordingly, the HV transistor of exemplary embodiments of the present invention may have a lower on-resistance as well as a higher breakdown voltage.

According to exemplary embodiments of the present invention, an edge portion of a gate electrode of an HV transistor is comprised of a thermal oxide, and thus, electric field intensity is sufficiently reduced at the edge portion of the gate electrode. Hot carriers caused by the high electric field intensity are minimized or prevented, and the HV transistor formed has a high breakdown voltage. Furthermore, the gate oxide layer of the HV transistor includes a thermal oxide pattern and a CVD oxide pattern, so that current and on-resistance characteristics may be sufficiently improved in the HV transistor of exemplary embodiments of the present invention, and more particularly, in an LDMOS transistor.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A high voltage (HV) transistor comprising:
   a semiconductor substrate;
   a first insulation pattern on the substrate;
   a second insulation pattern covering substantially a whole surface of the first insulation pattern;
   a gate electrode including a first end portion and a second end portion opposite to the first end portion, the first end portion formed on the first insulation pattern and the second end portion formed on the second insulation pattern; and
   source/drain regions formed at surface portions of the substrate.

2. The transistor of claim 1, wherein the first and second insulation patterns are comprised of an oxide.

3. The transistor of claim 2, wherein the oxide of the first insulation pattern has physical properties different from that of the second insulation pattern.

4. The transistor of claim 1, wherein the second insulation pattern covers a whole surface of the first insulation pattern.

5. The transistor of claim 4, wherein the first end portion of the gate electrode is formed on the second insulation pattern below which the first insulation pattern is formed.

6. The transistor of claim 1, wherein the second insulation pattern makes contact with a sidewall of the first insulation pattern.

7. The transistor of claim 1, wherein the gate electrode is comprised of polysilicon.

8. The transistor of claim 1, wherein the source/drain regions are doped with P type impurities.

9. The transistor of claim 1, wherein the source/drain regions are spaced apart from the first insulation pattern by a predetermined distance.

10. The transistor of claim 9, wherein the distance is in a range between about 2 µm and about 8 µm.

11. The transistor of claim 1, wherein the first insulation pattern has a length of about 1 µm and about 5 µm.

12. The transistor of claim 1, wherein the first insulation pattern has a thickness of about 4,000 Å to about 10,000 Å, and the second insulation pattern has a thickness of about 5,000 Å to about 15,000 Å.

13. A high voltage transistor comprising:
   a semiconductor substrate;
   a thermal oxide pattern on the substrate;
   a chemical vapor deposition (CVD) oxide pattern covering substantially a whole surface of the thermal oxide pattern;
   a gate electrode including a first end portion and a second end portion opposite to the first end portion, the first end portion being formed on the thermal oxide pattern and the second end portion being formed on the CVD oxide pattern; and
   source/drain regions formed at surface portions of the substrate.

14. The transistor of claim 13, further comprising a well region formed on the substrate and including either the source region or the drain region, the well region being overlapped with a portion of the CVD oxide pattern.

15. The transistor of claim 14, wherein the well region is overlapped with a portion of the thermal oxide pattern.

16. The transistor of claim 14, wherein the well region is doped with either P type impurities or N type impurities.

17. The transistor of claim 16, wherein impurity concentration of the well region is lower than that of the source/drain regions.

18. A high voltage transistor comprising:
   a semiconductor substrate;
   a first well region formed at surface portions of the substrate and including first impurities;
   a second well region adjacent to the first well region and including second impurities;
   a thermal oxide pattern formed on the substrate between the first and second well regions, wherein the thermal oxide pattern is in direct contact with one of the first well region or the second well region;
   a chemical vapor deposition (CVD) oxide pattern covering the thermal oxide pattern and overlapped with portions of the first and second well regions;
   a gate electrode including a first end portion and a second end portion opposite to the first end portion, the first end portion formed on the thermal oxide pattern and the second end portion formed on the CVD oxide pattern; and
   source/drain regions formed at surface portions of the substrate, the source/drain regions formed in the first and second well regions, respectively.

19. The transistor of claim 18, wherein the first impurities include P type impurities and the second impurities include N type impurities.

20. A method of manufacturing a high voltage transistor, comprising:
   forming first and second insulation patterns on a semiconductor substrate, the first insulation pattern including an oxidized portion of the substrate, and the second insulation pattern covering substantially a whole surface of the first insulation pattern;

forming a gate electrode on the substrate by depositing a conductive material onto the substrate, a first end portion of the gate electrode formed on the first insulation pattern, and a second end portion of the gate electrode formed on the second insulation pattern; and forming source/drain regions at surface portions of the substrate by implanting impurities onto surface portions of the substrate.

21. The method of claim 20, wherein forming the first and second insulation patterns includes: forming the first insulation pattern by oxidizing a portion of the substrate; and forming the second insulation pattern through a chemical vapor deposition process.

22. The method of claim 21, wherein the second insulation pattern covers a whole surface of the first insulation pattern.

23. The method of claim 20, wherein the second insulation pattern makes contact with a sidewall of the first insulation pattern.

24. The method of claim 23, wherein forming the first and second insulation patterns includes:
forming the second insulation pattern on the substrate through a chemical vapor deposition process;
forming a nitride pattern on the second insulation pattern;
forming the first insulation pattern by oxidizing the substrate exposed through the second insulation pattern; and
removing the nitride pattern from the substrate.

25. The method of claim 23, wherein forming the first and second insulation patterns includes:
forming the first insulation pattern on the substrate by oxidizing a portion of the substrate;
forming the second insulation pattern by a chemical vapor deposition process such that the second insulation pattern covers a whole surface of the first insulation pattern; and
removing a portion of the second insulation pattern from the substrate.

26. The method of claim 20, wherein forming the first insulation pattern includes:
sequentially forming a buffer oxide layer and a nitride layer on the substrate;
partially etching the nitride layer, thereby forming a nitride pattern through which the buffer oxide layer is partially exposed;
forming a first insulation pattern comprised of an oxide by performing a thermal oxidation process on the buffer oxide layer exposed through the nitride layer; and
removing the buffer oxide layer and the nitride layer.

27. The method of claim 26, wherein the thermal oxidation process is performed at a temperature of about 700° C. to about 1,400° C.

28. The method of claim 20, wherein forming the second insulation pattern includes:
forming an insulation layer comprised of an oxide on the substrate through a chemical vapor deposition process; and partially etching the insulation layer, thereby forming the second insulation pattern;

29. The method of claim 28, wherein the insulation layer is etched through a wet-etching process.

30. The method of claim 20, wherein the impurities include P type impurities.

31. A method of manufacturing a high voltage transistor, comprising:

forming a thermal oxide pattern on a semiconductor substrate by oxidizing a portion of the substrate;

forming a chemical vapor deposition (CVD) oxide pattern covering substantially a whole surface of the thermal oxide pattern;

forming a gate electrode, which includes a first end portion and a second end portion opposite to the first end portion, on the substrate by depositing conductive materials, the first end portion of the gate electrode being formed on a first portion of the CVD oxide pattern of which a lower surface makes contact with the thermal oxide pattern, and the second end portion of the gate electrode being formed on a second portion of the CVD oxide pattern of which a lower surface makes contact with the substrate; and forming source/drain regions at first surface portions of the substrate by implanting first impurities onto the first surface portions of the substrate.

32. The method of claim 31, prior to forming the thermal oxide pattern, further comprising forming a well region at second surface portions of the substrate by implanting second impurities onto the second surface portions of the substrate.

33. The method of claim 32, wherein the well region includes the first surface portions of the substrate for the source/drain regions, and is overlapped with a portion of the CVD oxide pattern.

34. The method of claim 33, wherein the well region is overlapped with the thermal oxide pattern.

35. The method of claim 32, wherein the second impurities include either N type impurities or P type impurities.

36. A method of manufacturing a high voltage transistor, comprising:
forming first and second well regions at first and second surface portions of a semiconductor substrate by implanting first and second impurities onto the substrate, respectively, the second surface portions being adjacent to the first surface portions of the substrate;
forming a thermal oxide pattern on the substrate by oxidizing a portion of the substrate between the first and second well regions, wherein the thermal oxide pattern is in direct contact with one of the first well region or the second well region;
forming a chemical vapor deposition (CVD) oxide pattern covering the thermal oxide pattern and overlapped with portions of the first and second well regions;
forming a gate electrode, which includes a first end portion and a second end portion opposite to the first end portion, on the substrate by depositing conductive materials, the first end portion of the gate electrode being formed on a first portion of the CVD oxide pattern of which a lower surface makes contact with the thermal oxide pattern, and the second end portion of the gate electrode being formed on a second portion of the CVD oxide pattern of which a lower surface makes contact with the substrate; and
forming source/drain regions at third surface portions of the substrate by implanting third impurities onto the substrate.

37. The method of claim 36, wherein the first impurities include P type impurities and the second impurities include N type impurities.

38. The method of claim 36, wherein the third impurities include P type impurities.

* * * * *